US008611121B2

(12) United States Patent
Ahn et al.

(10) Patent No.: US 8,611,121 B2
(45) Date of Patent: Dec. 17, 2013

(54) STACKED MEMORY DEVICES

(75) Inventors: Seung-eon Ahn, Hwaseong-si (KR);
Ho-jung Kim, Suwon-si (KR);
Chul-woo Park, Yongin-si (KR);
Sang-beom Kang, Hwaseong-si (KR);
Hyun-ho Choi, Suwon-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 412 days.

(21) Appl. No.: 12/662,785

(22) Filed: May 4, 2010

(65) Prior Publication Data
US 2010/0309705 A1 Dec. 9, 2010

(30) Foreign Application Priority Data

May 4, 2009 (KR) .................. 10-2009-0038949
Jan. 18, 2010 (KR) .................. 10-2010-0004481

(51) Int. Cl.
*G11C 5/02* (2006.01)

(52) U.S. Cl.
USPC ....................... 365/51; 365/230.03

(58) Field of Classification Search
USPC ............... 365/51, 63, 230.03, 230.06
See application file for complete search history.

(56) References Cited

U.S. PATENT DOCUMENTS

| | | | | |
|---|---|---|---|---|
| 6,646,912 B2 * | 11/2003 | Hurst et al. | .................. | 365/175 |
| 7,106,639 B2 * | 9/2006 | Taussig et al. | ................ | 365/200 |
| 7,898,893 B2 * | 3/2011 | Park et al. | ................ | 365/230.03 |
| 7,940,578 B2 * | 5/2011 | Kang et al. | ............... | 365/189.09 |
| 2004/0190360 A1 | 9/2004 | Scheuerlein | | |
| 2009/0086525 A1 * | 4/2009 | Park et al. | ........................ | 365/94 |

FOREIGN PATENT DOCUMENTS

| | | | |
|---|---|---|---|
| EP | 2 037 461 A2 | 3/2009 | |
| EP | 2 175 453 A1 | 4/2010 | |
| WO | WO 02/078001 A2 | 10/2002 | |
| WO | WO 2005/117021 A1 | 12/2005 | |

OTHER PUBLICATIONS

European Search Report dated Aug. 25, 2010.
European Search Report for App. No 10161832.0, dated Dec. 20, 2010.

* cited by examiner

*Primary Examiner* — Vanthu Nguyen
(74) *Attorney, Agent, or Firm* — Harness, Dickey & Pierce P.L.C.

(57) ABSTRACT

A stacked memory device may include a substrate, a plurality of memory groups sequentially stacked on the substrate, each memory group including at least one memory layer, a plurality of X-decoder layers, at least one of the plurality of X-decoder layers being disposed between every alternate neighboring two of the plurality of memory groups, and a plurality of Y-decoder layers disposed alternately with the plurality of X-decoder layers, at least one of the plurality of Y-decoder layers being disposed between every alternate neighboring two of the plurality of memory groups.

28 Claims, 21 Drawing Sheets

STACKED MEMORY DEVICES

CROSS-REFERENCE TO RELATED APPLICATION(S)

This application claims priority from Korean Patent Application No. 10-2009-0038949, filed on May 4, 2009, and Korean Patent Application No. 10-2010-0004481, filed on Jan. 18, 2010, in the Korean Intellectual Property Office (KIPO), the entire contents of both of which are incorporated herein by reference.

BACKGROUND

1. Field

Example embodiments relate to semiconductor devices. Also, example embodiments relate to memory devices stacked in multilayer structures.

2. Description of the Related Art

As semiconductor products may be getting smaller, demand for processing large amounts of data may be increasing. As such, the need for increased integration of nonvolatile memory devices used in semiconductor products may also be increasing. In this regard, multilayer memory devices formed by stacking memory layers three-dimensionally may be considered.

However, circuits for supporting operations of multilayer memory devices may not be easily arranged and/or increases in integration density may be restricted.

SUMMARY

Example embodiments may provide stacked memory devices capable of being easily and/or highly integrated.

Additional aspects will be set forth in part in the description which follows and, in part, will be apparent from the description, or may be learned by practice of example embodiments.

According to example embodiments, a stacked memory device may include a substrate; a plurality of memory groups sequentially stacked on the substrate, each memory group including at least one memory layer; a plurality of X-decoder layers, at least one of the plurality of X-decoder layers being disposed between every alternate neighboring two of the plurality of memory groups; and/or a plurality of Y-decoder layers disposed alternately with the plurality of X-decoder layers, at least one of the plurality of Y-decoder layers being disposed between every alternate neighboring two of the plurality of memory groups.

The plurality of X-decoder layers and the plurality of Y-decoder layers may be alternately disposed between the plurality of memory groups.

Each of the X-decoder layers may be connected to a neighboring two of the plurality of memory groups, which may be stacked on and under each of the X-decoder layers, respectively, and/or each of the Y-decoder layers may be connected to a neighboring two of the plurality of memory groups, which may be stacked on and under each of the Y-decoder layers, respectively.

The plurality of Y-decoder layers may include a plurality of pairs of first and second Y-decoder layers that may alternate with the plurality of X-decoder layers, the first and second Y-decoder layers of each of the pairs of the first and second Y-decoder layers may be stacked on one another, and/or each of the plurality of X-decoder layers may be disposed between every alternate neighboring two of the plurality of memory groups.

The plurality of X-decoder layers may include a plurality of pairs of first and second X-decoder layers that may alternate with the plurality of Y-decoder layers, the first and second X-decoder layers of each of the pairs of the first and second X-decoder layers may be stacked on one another, and/or each of the plurality of Y-decoder layers may be disposed between every alternate neighboring two of the plurality of memory groups.

Each of the plurality of X-decoder layers may include a number of X-decoder pairs corresponding to the number of memory layers of each of the plurality of memory groups, and/or each of the plurality of Y-decoder layers may include a number of Y-decoder pairs corresponding to the number of memory layers of each of the plurality of memory groups. Memory cells of each of the memory layers may be grouped into first and second groups, X-decoders of each of the X-decoder pairs may be separately connected to the first and second groups of a corresponding memory layer, and/or Y-decoders of each of the Y-decoder pairs may be separately connected to the first and second groups of a corresponding memory layer.

Each of the plurality of X-decoder layers may include a number of X-decoders corresponding to the number of memory layers of each of the plurality of memory groups, and/or each of the plurality of Y-decoder layers may include a number of Y-decoders corresponding to the number of memory layers of each of the plurality of memory groups.

According to example embodiments, a stacked memory device may include a plurality of stacked memory blocks disposed on a substrate, each of the plurality of stacked memory blocks including a plurality of memory groups sequentially stacked on the substrate, each memory group including at least one memory layer; a plurality of X-decoder arrays, each X-decoder array being disposed in every other memory group from among the plurality of the memory groups; and/or a plurality of Y-decoder arrays disposed alternately with the plurality of X-decoder arrays, each Y-decoder array being disposed in every other memory group from among the plurality of the memory groups.

The plurality of X-decoder arrays of each of the stacked memory blocks may be disposed at the same levels as the plurality of Y-decoder arrays of the neighboring stacked memory blocks.

Each of the plurality of X-decoder arrays may include a number of X-decoder pairs corresponding to a half of the number of memory layers of each of the plurality of memory groups and/or each of the X-decoder pairs may be commonly connected to at least two memory layers. Each of the plurality of Y-decoder arrays may include a number of Y-decoder pairs corresponding to a half of the number of memory layers of each of the plurality of memory groups and/or each of the Y-decoder pairs may be commonly connected to at least two memory layers. Memory cells of each of the memory layers may be grouped into first and second groups, X-decoders of each of the X-decoder pairs may be separately connected to the first and second groups of a corresponding memory layer, and/or Y-decoders of each of the Y-decoder pairs may be separately connected to the first and second groups of a corresponding memory layer.

Each of the plurality of X-decoder arrays may include a number of X-decoders corresponding to a half of the number of memory layers of each of the plurality of memory groups and/or each of the X-decoders may be commonly connected to at least two memory layers. Each of the plurality of Y-decoder arrays may include a number of Y-decoders corresponding to a half of the number of memory layers of each of the plurality of the memory groups and/or each of the Y-decoders may be commonly connected to at least two memory layers.

According to example embodiments, a stacked memory device may include a substrate; a plurality of memory groups sequentially stacked on the substrate, each memory group including at least one memory layer; and/or at least one decoder layer in at least one of the plurality of the memory groups. The at least one decoder layer may include an X-decoder array including at least one X-decoder and/or a Y-decoder array including at least one Y-decoder. The at least one X-decoder array and the at least one Y-decoder array in each of the at least one decoder layer may be disposed in a lattice pattern.

The at least one X-decoder array may include a plurality of X-decoders, and/or the at least one Y-decoder array may include a plurality of Y-decoders. Furthermore, the plurality of X-decoder arrays and the plurality of Y-decoder arrays may be alternately disposed.

A stacked memory device may include a substrate; a plurality of memory groups sequentially stacked on the substrate, each memory group including at least one memory layer; a plurality of X-decoder layers, at least one of the plurality of X-decoder layers being disposed between every alternate neighboring two of the plurality of memory groups; and/or plurality of Y-decoder layers disposed alternately with the plurality of X-decoder layers, at least one of the plurality of Y-decoder layers being disposed between every alternate neighboring two of the plurality of memory groups.

A stacked memory device may include a plurality of stacked memory blocks disposed on a substrate. Each of the plurality of stacked memory blocks may include a plurality of memory groups sequentially stacked on the substrate, each memory group including at least one memory layer, a plurality of X-decoder arrays, each X-decoder array being disposed in every other memory group from among the plurality of memory groups, and/or a plurality of Y-decoder arrays disposed alternately with the plurality of X-decoder arrays, each Y-decoder array being disposed in every other memory group from among the plurality of memory groups.

A stacked memory device may include a substrate, a plurality of memory groups sequentially stacked on the substrate, each memory group including one or more memory layers, one or more decoder layers in at least one of the plurality of memory groups. The one or more decoder layers may include an X-decoder array including at least one X-decoder and/or a Y-decoder array including at least one Y-decoder. The X-decoder array and the Y-decoder array in each of the one or more decoder layers may be disposed in a grid pattern.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
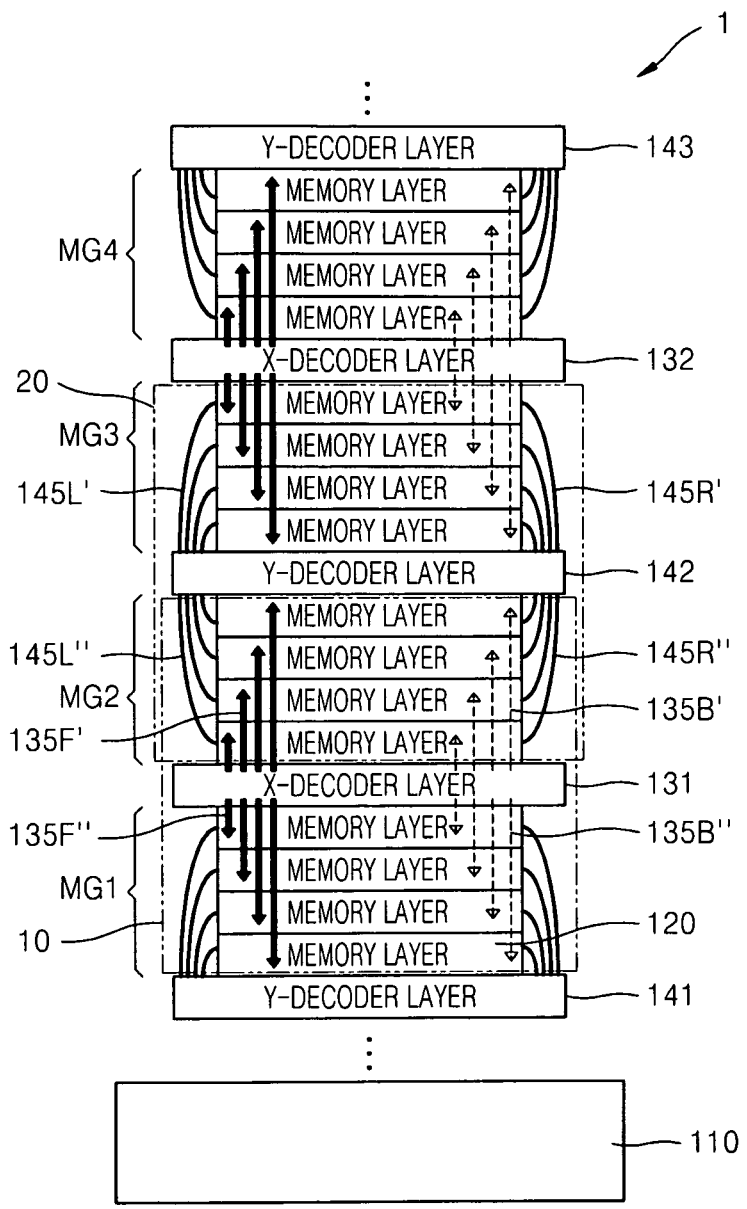
FIG. 1 is a cross-sectional view of a stacked memory device according to example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions are exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a cross-sectional view of a stacked memory device 1 according to example embodiments.

Referring to FIG. 1, the stacked memory device 1 may include a substrate 110, a plurality of memory layers 120, a plurality of X-decoder layers 131 and 132, and/or a plurality of Y-decoder layers 141 through 143. Although two X-decoder layers 131 and 132 and three Y-decoder layers 141 through 143 are illustrated in FIG. 1 for convenience, the stacked memory device 1 may include larger numbers of X-decoder layers and/or Y-decoder layers. The elements of the stacked memory device 1 will now be described.

The memory layers 120 may be sequentially stacked on the substrate 110. For example, the substrate 110 may include a semiconductor wafer. The stacked structure of the memory layers 120 may be effective in increasing the integration density of the stacked memory device 1 and/or in increasing the capacity of the stacked memory device 1. Each of the memory layers 120 may include a memory cell array in a matrix. The number of memory layers 120 may be appropriately selected according to the capacity of the stacked memory device 1. The memory layers 120 may include at least one memory selected from the group consisting of dynamic random access memory (DRAM), static random access memory (SRAM), flash memory, phase change random access memory (PRAM), resistive random access memory (ReRAM), ferroelectric random access memory (FeRAM), and/or magnetoresistive random access memory (MRAM).

The memory layers 120 may be grouped into a plurality of memory groups MG1 through MG4 and/or the memory groups MG1 through MG4 may include the same number of memory layers 120. Although each of the memory groups MG1 through MG4 may include four memory layers 120 in FIG. 1, four is an exemplary number of memory layers 120 of each of the memory groups MG1 through MG4 and does not restrict the example embodiments. According to example embodiments, the memory groups MG1 through MG4 may include different numbers of memory layers 120.

A plurality of X-decoder layers 131 and 132 and a plurality of Y-decoder layers 141 through 143 may be alternately disposed between the memory groups MG1 through MG4. In more detail, in the stacked memory device 1, the Y-decoder layer 141, the memory group MG1, the X-decoder layer 131, the memory group MG2, the Y-decoder layer 142, the memory group MG3, the X-decoder layer 132, the memory group MG4, and/or the Y-decoder layer 143 may be sequentially stacked on the substrate 110. In this case, the X-decoder layer 131 and the memory groups MG1 and MG2 disposed under and on the X-decoder layer 131 may be referred to as a first basic stacked structure 10, and/or the Y-decoder layer 142 and the memory groups MG2 and MG3 disposed under and on the Y-decoder layer 142 may be referred to as a second basic stacked structure 20. The first and second basic stacked structures 10 and 20 will now be described.

The stacked memory device 1 may include a plurality of first basic stacked structures 10 stacked on the substrate 110 and a plurality of Y-decoder layers 141 through 143 may be interposed between the first basic stacked structures 10. In the first basic stacked structure 10, the X-decoder layer 131 may be connected through first front connection lines 135F' and/or first back connection lines 135B' to the memory layers 120 of the memory group MG2 stacked on the X-decoder layer 131, and/or may be connected through second front connection lines 135F" and/or second back connection lines 135B" to the memory layers 120 of the memory group MG1 stacked under the X-decoder layer 131. In more detail, the first and second front connection lines 135F' and 135F" and/or the first and second back connection lines 135B' and 135B" may be connected to X-decoder wires (not shown) separately connected to the memory layers 120. The X-decoder wires may be word lines.

The X-decoder layer 131 may electrically exchange signals with the memory layers 120 of the memory groups MG1 and MG2. For example, the X-decoder layer 131 may decode X-axis address information regarding memory cells of the memory layers 120 and/or may transmit the decoded X-axis address information to the memory layers 120. The X-decoder layer 131 may further be electrically connected to an X-buffer (not shown) and/or an X-driver (not shown) on the substrate 110.

The first and second front connection lines 135F' and 135F" (illustrated as solid-line arrows in FIG. 1) may indicate connection correlations in a direction perpendicular to the surface of FIG. 1 from the front of the X-decoder layer 131 and the memory layers 120. Meanwhile, the first and second back connection lines 135B' and 135B" (illustrated as dashed-line arrows in FIG. 1) may indicate connection correlations in a direction perpendicular to the surface of FIG. 1 from the back of the X-decoder layer 131 and the memory layers 120. Accordingly, the first and second back connection lines 135B' and 135B" are not shown from the cross-sectional view of FIG. 1 and thus are illustrated as dashed-line arrows.

Figure 2:
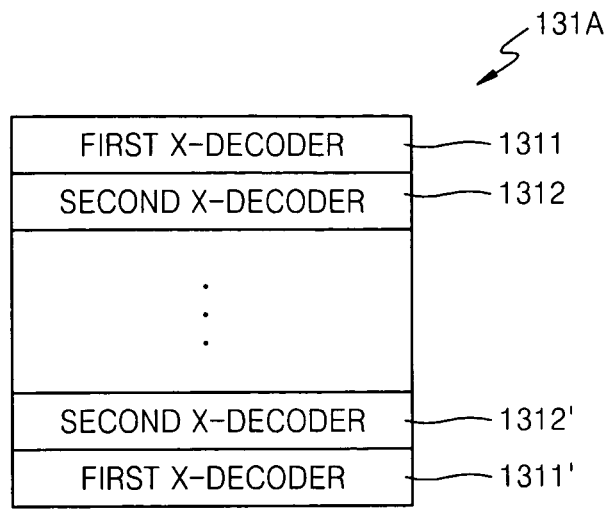
FIG. 2 is a schematic diagram of an X-decoder array of an X-decoder layer in the stacked memory device illustrated in FIG. 1, according to example embodiments.

FIG. 2 is a schematic diagram of an X-decoder array 131A of the X-decoder layer 131 in the stacked memory device 1 illustrated in FIG. 1, according to example embodiments.

Referring to FIGS. 1 and 2, the X-decoder layer 131 may include at least one X-decoder array 131A. The X-decoder array 131A may include a plurality of X-decoders 1311, 1312, 1311', and/or 1312'. Although four X-decoders 1311, 1312, 1311', and 1312' are illustrated in FIG. 2 for convenience, the X-decoder array 131A may include a larger number of X-decoders.

The memory cells of the memory layers 120 may be grouped into two groups. For example, from among the memory cells of the memory layers 120, odd-number memory cells may be grouped into a first group and/or even-number memory cells may be grouped into a second group. However, the above method is an exemplary method and the memory cells of the memory layers 120 may be grouped by using a different method. In order to decode the X-axis address information regarding the memory cells grouped into two groups, the X-decoder array 131A may include a plurality of X-decoder pairs corresponding to the memory layers 120 of a memory group. Accordingly, the X-decoder array 131A may include X-decoders corresponding to a double of the number of memory layers 120 of each memory group.

Since each of the memory groups MG1 through MG4 may include four memory layers 120 in FIG. 1, the X-decoder array 131A may include four pairs of X-decoders, i.e., eight X-decoders. In more detail, in the X-decoder array 131A, two first X-decoders 1311 and 1311' may form a first X-decoder pair and/or two second X-decoders 1312 and 1312' may form a second X-decoder pair. Connection correlations between each pair of X-decoders and the memory layers 120 will now be described.

The first X-decoders 1311 and 1311' may be commonly connected to the most adjacent memory layers 120 on and under the X-decoder layer 131. The first X-decoder 1311 may be connected through a first front connection line 135F' to a first group in the most adjacent memory layer 120 on the X-decoder layer 131, and/or may be connected through a second front connection line 135F" to a first group in the most adjacent memory layer 120 under the X-decoder layer 131. The first X-decoder 1311' may be connected through a first back connection line 135B' to a second group in the most adjacent memory layer 120 on the X-decoder layer 131, and/or may be connected through a second back connection line 135B" to a second group in the most adjacent memory layer 120 under the X-decoder layer 131.

The second X-decoders 1312 and 1312' may be commonly connected to the second-most adjacent memory layers 120 on and under the X-decoder layer 131. The second X-decoder 1312 may be connected through a first front connection line 135F' to a first group in the second-most adjacent memory layer 120 on the X-decoder layer 131, and/or may be connected through a second front connection line 135F" to a first group in the second-most adjacent memory layer 120 under the X-decoder layer 131. The second X-decoder 1312' may be connected through a first back connection line 135B' to a second group in the second-most adjacent memory layer 120 on the X-decoder layer 131, and/or may be connected through a second back connection line 135B" to a second group in the second-most adjacent memory layer 120 under the X-decoder layer 131.

According to example embodiments, memory cells of a memory layer 120 may be grouped into two groups and/or a pair of X-decoders may be commonly connected to memory layers 120 that are symmetrically disposed on and under the X-decoder layer 131. One of the pair of X-decoders may be connected to the first group in the memory layer 120 and/or the other of the pair of X-decoders may be connected to the second group in the memory layer 120. As such, the number of memory cells to be decoded by the X-decoder layer 131 may be reduced. Accordingly, the X-decoder layer 131 may reduce complexity and/or may be simply realized.

Referring back to FIG. 1, the stacked memory device 1 may include a plurality of second basic stacked structures 20 stacked on the substrate 110 and/or a plurality of X-decoder layers 131 and 132 may be interposed between the second basic stacked structures 20. In a second basic stacked structure 20, the Y-decoder layer 142 may be connected through first left connection lines 145L' and first right connection lines 145R' to the memory layers 120 of the memory group MG3 stacked on the Y-decoder layer 142, and/or may be connected through second left connection lines 145L" and second right connection lines 145R" to the memory layers 120 of the memory group MG2 stacked under the Y-decoder layer 142. In more detail, the first and second left connection lines 145L' and 145L" and/or the first and second right connection lines 145R' and 145R" may be connected to Y-decoder wires (not shown) separately connected to the memory layers 120. The Y-decoder wires may be bit lines.

The Y-decoder layer 142 may electrically exchange signals with the memory layers 120 of the memory groups MG2 and MG3. For example, the Y-decoder layer 142 may decode Y-axis address information regarding memory cells of the memory layers 120 and/or may transmit the decoded Y-axis address information to the memory layers 120. The Y-decoder layer 142 may further be electrically connected to a Y-buffer (not shown) and/or a Y-driver (not shown) on the substrate 110.

The first and second left connection lines 145L' and 145L" and the first and second right connection lines 145R' and 145R" (illustrated as solid lines in FIG. 1) may indicate connection correlations in directions parallel to the surface of FIG. 1. The first and second front connection lines 135F' and 135F" (illustrated as solid-line arrows) and the first and second back connection lines 135B' and 135B" (illustrated as dashed-line arrows) may indicate connection correlations in directions perpendicular to the first and second left connection lines 145L' and 145L" and/or the first and second right connection lines 145R' and 145R".

Figure 3:
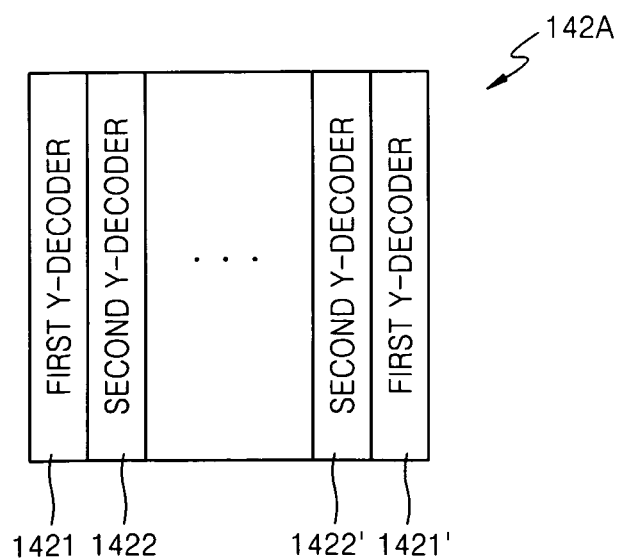
FIG. 3 is a schematic diagram of a Y-decoder array of a Y-decoder layer in the stacked memory device illustrated in FIG. 1, according to example embodiments.

FIG. 3 is a schematic diagram of a Y-decoder array 142A of the Y-decoder layer 142 in the stacked memory device 1 illustrated in FIG. 1, according to example embodiments. Referring to FIGS. 1 and 3, the Y-decoder layer 142 may include at least one Y-decoder array 142A. The Y-decoder array 142A may include a plurality of Y-decoders 1421, 1422, 1421', and/or 1422'. Although four Y-decoders 1421, 1422, 1421', and 1422' are illustrated in FIG. 3 for convenience, the Y-decoder array 142A may include a larger number of Y-decoders.

The memory cells of the memory layers 120 may be grouped into two groups. For example, from among the memory cells of the memory layers 120, odd-number memory cells may be grouped into a first group and/or even-number memory cells may be grouped into a second group. However, the above method is an exemplary method and the memory cells of the memory layers 120 may be grouped by using a different method. In order to decode the Y-axis address information regarding the memory cells grouped into two groups, the Y-decoder array 142A may include a plurality of Y-decoder pairs corresponding to the memory layers 120 of a memory group. The Y-decoder array 142A may include Y-decoders corresponding to a double of the number of memory layers 120 of each memory group.

Since each of the memory groups MG1 through MG4 may include four memory layers 120 in FIG. 1, the Y-decoder array 142A may include four pairs of Y-decoders, i.e., eight Y-decoders. In more detail, in the Y-decoder array 142A, two first Y-decoders 1421 and 1421' may form a first Y-decoder pair and/or two second Y-decoders 1422 and 1422' may form a second Y-decoder pair. Connection correlations between each pair of Y-decoders and the memory layers 120 will now be described.

The first Y-decoders 1421 and 1421' may be commonly connected to the most adjacent memory layers 120 on and under the Y-decoder layer 142. The first Y-decoder 1421 may be connected through a first left connection line 145L' to a first group in the most adjacent memory layer 120 on the Y-decoder layer 142, and/or may be connected through a second left connection line 145L" to a first group in the most adjacent memory layer 120 under the Y-decoder layer 142. The first Y-decoder 1421' may be connected through a first right connection line 145R' to a second group in the most adjacent memory layer 120 on the Y-decoder layer 142, and/or may be connected through a second right connection line 145R" to a second group in the most adjacent memory layer 120 under the Y-decoder layer 142.

The second Y-decoders 1422 and 1422' may be commonly connected to the second-most adjacent memory layers 120 on and under the Y-decoder layer 142. The second Y-decoder 1422 may be connected through a first left connection line 145L' to a first group in the second-most adjacent memory layer 120 on the Y-decoder layer 142, and/or may be connected through a second left connection line 145L" to a first group in the second-most adjacent memory layer 120 under the Y-decoder layer 142. The second Y-decoder 1422' may be connected through a first right connection line 145R' to a second group in the second-most adjacent memory layer 120 on the Y-decoder layer 142, and/or may be connected through a second right connection line 145R" to a second group in the second-most adjacent memory layer 120 under the Y-decoder layer 142.

According to example embodiments, memory cells of a memory layer 120 may be grouped into two groups and/or a pair of Y-decoders may be commonly connected to memory layers 120 that are symmetrically disposed on and under the Y-decoder layer 142. One of the pair of Y-decoders may be connected to the first group in the memory layer 120 and/or the other of the pair of Y-decoders is connected to the second group in the memory layer 120. The number of memory cells to be decoded by the Y-decoder layer 142 may be reduced. Accordingly, the Y-decoder layer 142 may reduce complexity and/or may be simply realized.

Figure 4:
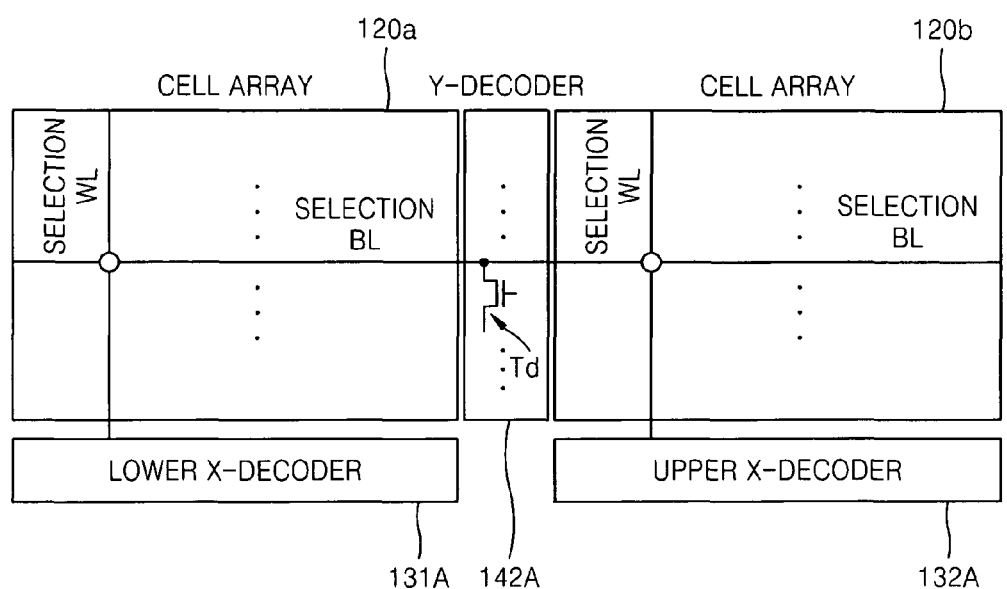
FIG. 4 is a schematic diagram showing connections among memory layers, X-decoder arrays, and a Y-decoder array in the stacked memory device illustrated in FIG. 1.

FIG. 4 is a schematic diagram showing connections among lower and upper memory layers 120a and 120b, lower and upper X-decoder arrays 131A and 132A, and a Y-decoder array 142A in the stacked memory device 1 illustrated in FIG. 1.

Referring to FIGS. 1 and 4, each of the lower and upper memory layers 120a and 120b may include a cell array. The Y-decoder array 142A between the lower and upper memory layers 120a and 120b may be commonly connected to the lower and upper memory layers 120a and 120b. For example, a selection bit line BL of the lower and upper memory layers 120a and 120b may be connected to a decoding transistor Td of the Y-decoder array 142A.

The lower X-decoder array 131A under the lower memory layer 120a may be connected to a selection word line WL of the lower memory layer 120a. The upper X-decoder array 132A on the upper memory layer 120b may be connected to a selection word line WL of the upper memory layer 120b.

Figure 5:
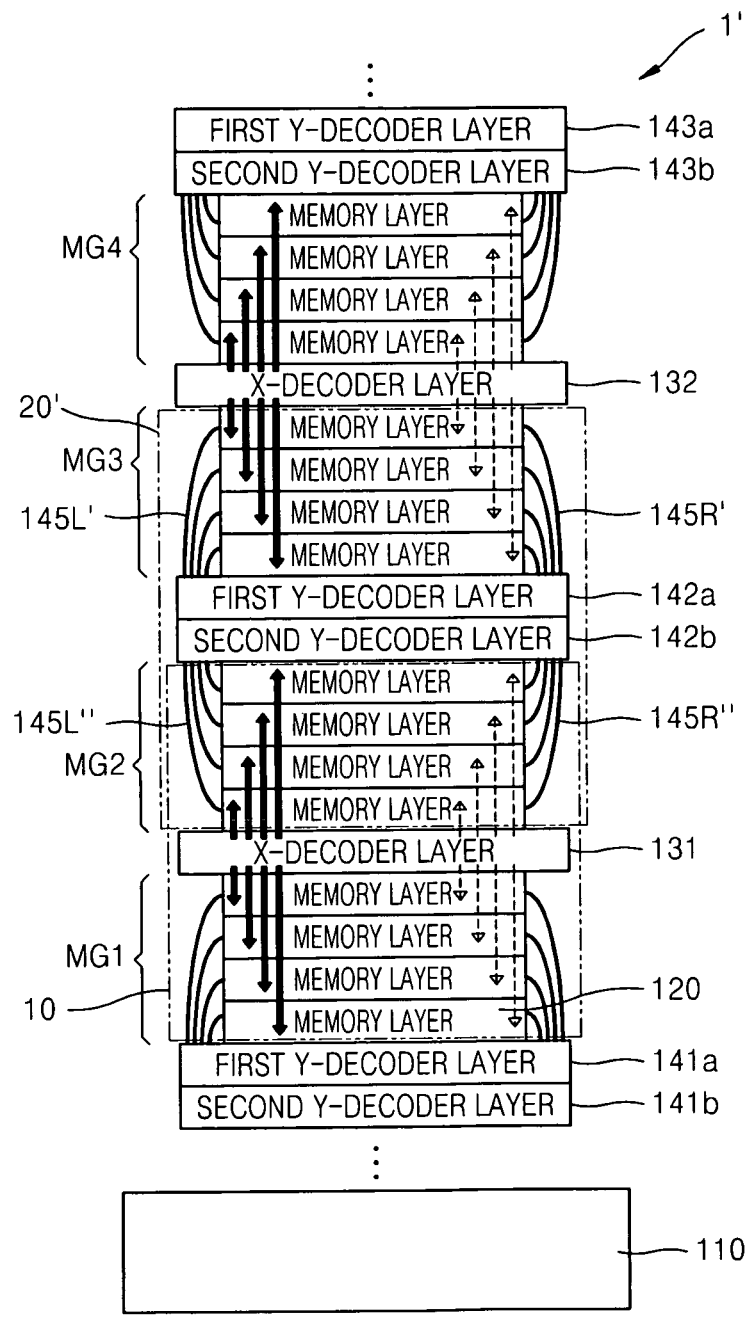
FIG. 5 is a cross-sectional view of a stacked memory device according to example embodiments.

FIG. 5 is a cross-sectional view of a stacked memory device 1' according to example embodiments.

Referring to FIG. 5, the stacked memory device 1' may include a substrate 110, a plurality of memory layers 120, a plurality of X-decoder layers 131 and 132, and/or a plurality of pairs of first Y-decoder layers 141a, 142a and 143a and/or second Y-decoder layers 141b, 142b and 143b. The stacked memory device 1' may be partially modified from the stacked memory device 1 illustrated in FIGS. 1 through 4 and thus repeated descriptions will not be provided here.

An X-decoder layer and a pair of first and second Y-decoder layers may be alternately disposed between a plurality of memory groups MG1 through MG4. In more detail, in the stacked memory device 1', a pair of the first and second Y-decoder layers 141a and 141b, the memory group MG1, the X-decoder layer 131, the memory group MG2, a pair of the first and second Y-decoder layers 142a and 142b, the memory group MG3, the X-decoder layer 132, the memory group MG4, and/or a pair of the first and second Y-decoder layers 143a and 143b may be sequentially stacked on the substrate 110. The X-decoder layer 131 and/or the memory groups MG1 and MG2 disposed under and on the X-decoder layer 131 may be referred to as a first basic stacked structure 10. The pair of the first and second Y-decoder layers 142a and 142b and/or the memory groups MG2 and MG3 disposed under and on the pair of the first and second Y-decoder layers 142a and 142b may be referred to as a second basic stacked structure 20'. The first basic stacked structure 10 illustrated in FIG. 5 may be substantially the same as the first basic stacked structure 10 illustrated in FIG. 1 and thus a detailed description thereof will not be provided here.

The stacked memory device 1' may include a plurality of second basic stacked structures 20' stacked on the substrate 110. A plurality of X-decoder layers 131 and 132 may be interposed between the second basic stacked structures 20'. In a second basic stacked structure 20', the first Y-decoder layer 142a may be connected through first left connection lines 145L' and first right connection lines 145R' to the memory layers 120 of the memory group MG3 stacked on the first Y-decoder layer 142a, and/or the second Y-decoder layer 142b may be connected through second left connection lines 145L" and second right connection lines 145R" to the memory layers 120 of the memory group MG2 stacked under the second Y-decoder layer 142b.

The first Y-decoder layer 142a may electrically exchange signals with the memory layers 120 of the memory group MG3 stacked on the first Y-decoder layer 142a. The second Y-decoder layer 142b may electrically exchange signals with the memory layers 120 of the memory group MG2 stacked under the second Y-decoder layer 142b.

According to example embodiments, neighboring two memory groups may share an X-decoder layer disposed therebetween but do not share Y-decoder layers disposed therebetween. In other words, since an X-decoder layer and a pair of Y-decoder layers may be alternately disposed between a plurality of memory groups, one X-decoder layer or two Y-decoder layers may be disposed between neighboring two memory groups. As such, Y-axis address information may be individually decoded with respect to memory layers of the neighboring two memory groups.

Figure 6:
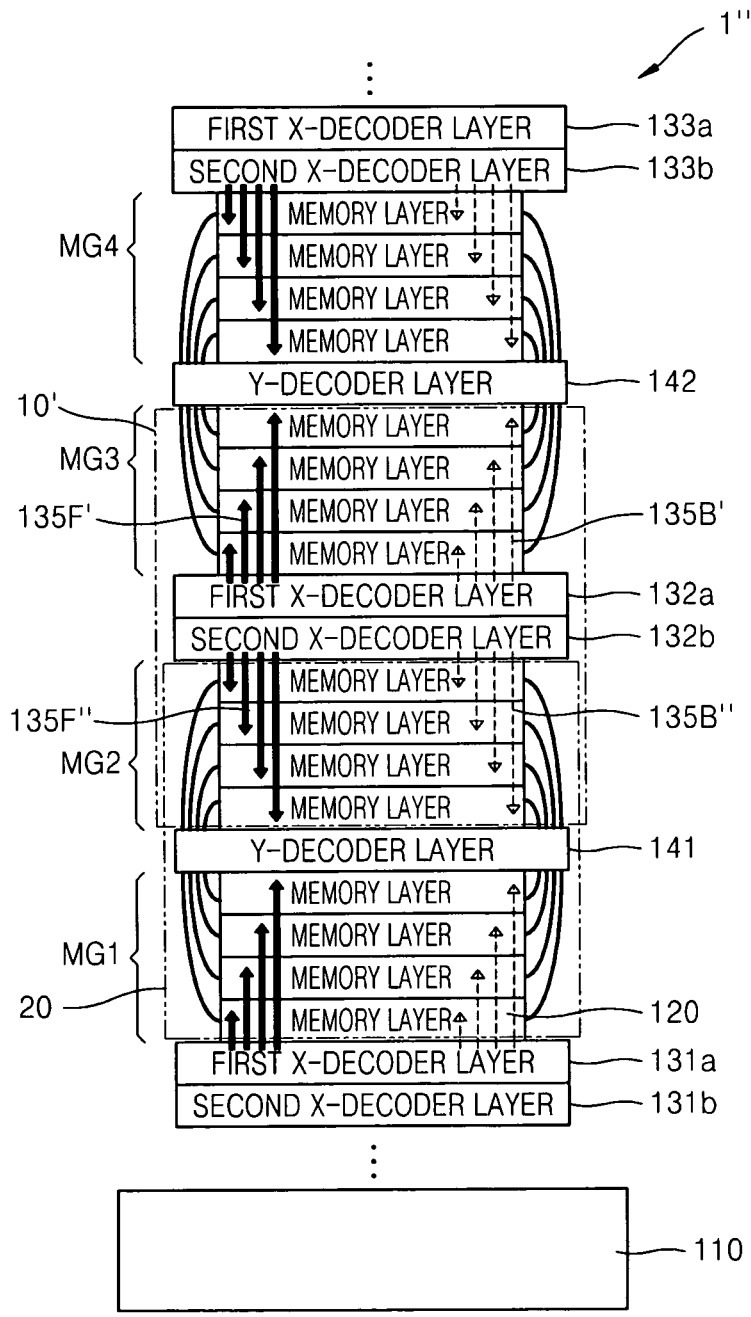
FIG. 6 is a cross-sectional view of a stacked memory device according to example embodiments.

FIG. 6 is a cross-sectional view of a stacked memory device 1" according to example embodiments.

Referring to FIG. 6, the stacked memory device 1" may include a substrate 110, a plurality of memory layers 120, a plurality of pairs of first X-decoder layers 131a, 132a, and 133a, and second X-decoder layers 131b, 132b and 133b, and/or a plurality of Y-decoder layers 141 and 142. The stacked memory device 1" may be partially modified from the stacked memory device 1 illustrated in FIGS. 1 through 4 and thus repeated descriptions will not be provided here.

A Y-decoder layer and/or a pair of first and second X-decoder layers may be alternately disposed between a plurality of memory groups MG1 through MG4. In more detail, in the stacked memory device 1", a pair of the first and second X-decoder layers 131a and 131b, the memory group MG1, the Y-decoder layer 141, the memory group MG2, a pair of the first and second X-decoder layers 132a and 132b, the memory group MG3, the Y-decoder layer 142, the memory group MG4, and/or a pair of the first and second X-decoder layers 133a and 133b may be sequentially stacked on the substrate 110. The Y-decoder layer 141 and the memory groups MG1 and MG2 disposed under and on the Y-decoder layer 141 may be referred to as a second basic stacked structure 20. The pair of the first and second X-decoder layers 132a and 132b and the memory groups MG2 and MG3 disposed under and on the pair of the first and second X-decoder layers 132a and 132b may be referred to as a first basic stacked structure 10'. The second basic stacked structure 20 illustrated in FIG. 8 may be substantially the same as the second basic stacked structure 20 illustrated in FIG. 1 and thus a detailed description thereof will not be provided here.

The stacked memory device 1" may include a plurality of first basic stacked structures 10' stacked on the substrate 110. A plurality of Y-decoder layers 141 and 142 may be interposed between the first basic stacked structures 10'. In a first basic stacked structure 10', the first X-decoder layer 132a may be connected through first front connection lines 135F' and first back connection lines 135B' to the memory layers 120 of the memory group MG3 stacked on the first X-decoder layer 132a, and/or the second X-decoder layer 132b may be connected through second front connection lines 135F" and second back connection lines 135B" to the memory layers 120 of the memory group MG2 stacked under the second X-decoder layer 132b.

The first X-decoder layer 132a may electrically exchange signals with the memory layers 120 of the memory group MG3 stacked on the first X-decoder layer 132a. The second X-decoder layer 132b may electrically exchange signals with the memory layers 120 of the memory group MG2 stacked under the second X-decoder layer 132b.

According to example embodiments, neighboring two memory groups may share a Y-decoder layer disposed therebetween, but do not share X-decoder layers disposed therebetween. In other words, since a Y-decoder layer and a pair of X-decoder layers may be alternately disposed between a plurality of memory groups, one Y-decoder layer or two X-decoder layers may be disposed between neighboring two memory groups. As such, X-axis address information may be individually decoded with respect to memory layers of the neighboring two memory groups.

Figure 7:
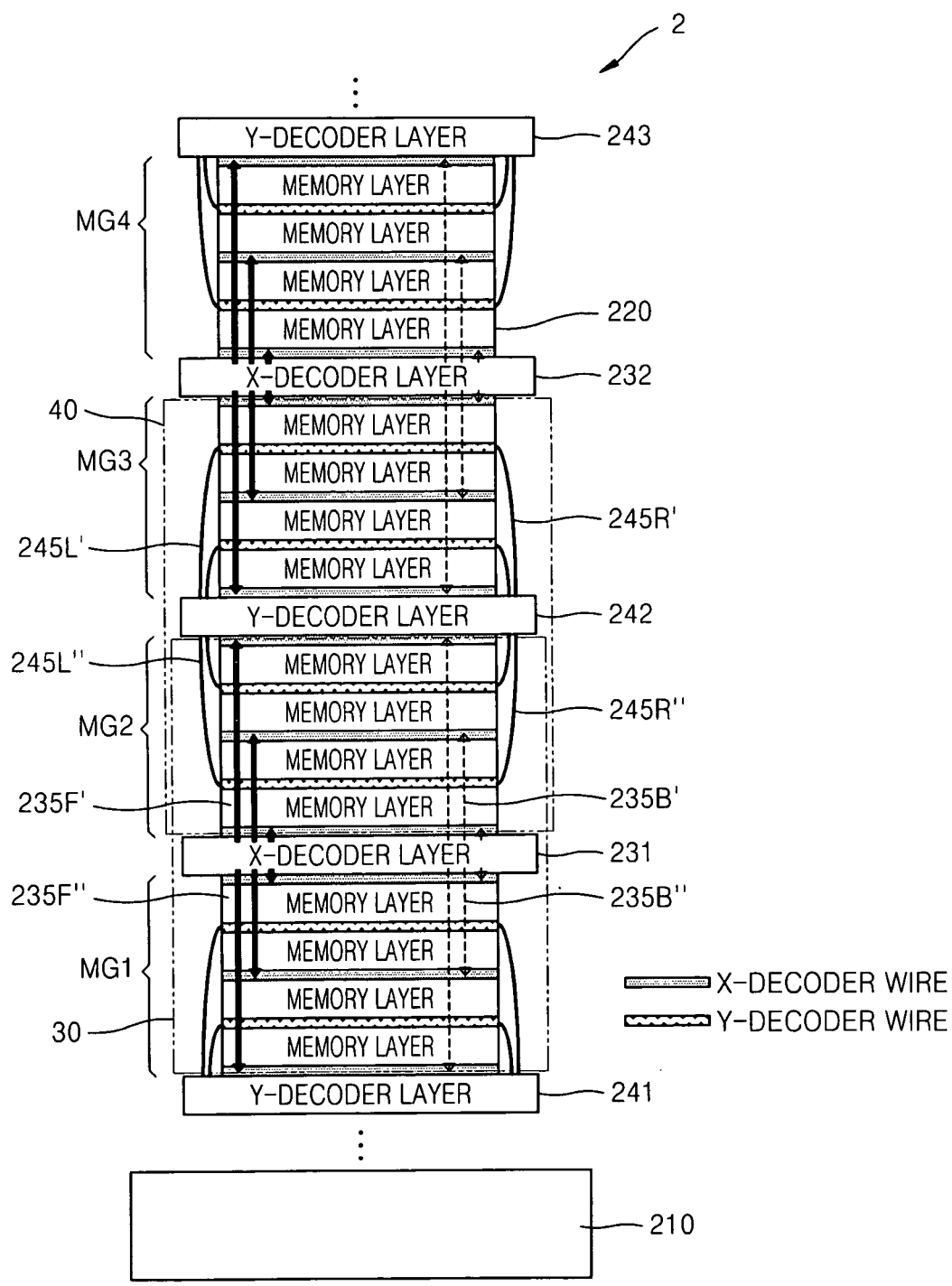
FIG. 7 is a cross-sectional view of a stacked memory device according to example embodiments.

FIG. 7 is a cross-sectional view of a stacked memory device 2 according to example embodiments.

Referring to FIG. 7, the stacked memory device 2 may include a substrate 210, a plurality of memory layers 220, a plurality of X-decoder layers 231 and 232, and/or a plurality of Y-decoder layers 241 through 243. Although two X-decoder layers 231 and 232 and three Y-decoder layers 241 through 243 are illustrated in FIG. 7 for convenience, the stacked memory device 2 may include larger numbers of X-decoder layers and/or Y-decoder layers. The stacked memory device 2 may be partially modified from the stacked memory device 1 illustrated in FIG. 1 and thus repeated descriptions will not be provided here.

A plurality of memory layers 220 may be stacked on the substrate 210 and may be grouped into a plurality of memory groups MG1 through MG4. A plurality of X-decoder layers 231 and 232 and/or a plurality of Y-decoder layers 241 through 243 may be alternately disposed between the memory groups MG1 through MG4. The X-decoder layer 231 and the memory groups MG1 and MG2 disposed under and on the X-decoder layer 231 may be referred to as a first basic stacked structure 30. The Y-decoder layer 242 and the memory groups MG2 and MG3 disposed under and on the Y-decoder layer 242 may be referred to as a second basic stacked structure 40. The first and second basic stacked structures 40 and 20 will now be described.

The stacked memory device 2 may include a plurality of first basic stacked structures 30 stacked on the substrate 210. A plurality of Y-decoder layers 241 through 243 may be interposed between the first basic stacked structures 30. In the first basic stacked structure 30, the X-decoder layer 231 may be connected through first front connection lines 235F' and first back connection lines 235B' to the memory layers 220 of the memory group MG2 stacked on the X-decoder layer 231, and/or may be connected through second front connection lines 235F" and second back connection lines 235B" to the memory layers 220 of the memory group MG1 stacked under the X-decoder layer 231.

Some of the memory layers 220 of the memory groups MG1 through MG4 may share X-decoder wires and/or the X-decoder wires may be word lines. In FIG. 7, second and third memory layers of the memory layers 220 included in each of the memory groups MG1 through MG4 may share an X-decoder wire. Accordingly, the X-decoder layer 231 may require three first front connection lines 235F' and/or three first back connection lines 235B' in order to be connected to the memory layers 220 of the memory group MG2 stacked on the X-decoder layer 231. Also, the X-decoder layer 231 may require three second front connection lines 235F" and/or three second back connection lines 235B" in order to be connected to the memory layers 220 of the memory group MG1 stacked under the X-decoder layer 231.

The stacked memory device 2 may include a plurality of second basic stacked structures 40 stacked on the substrate 210. A plurality of X-decoder layers 231 and 232 may be interposed between the second basic stacked structures 40. In a second basic stacked structure 40, the Y-decoder layer 242 may be connected through first left connection lines 245L' and first right connection lines 245R' to the memory layers 220 of the memory group MG3 stacked on the Y-decoder layer 242, and/or may be connected through second left connection lines 245L" and second right connection lines 245R" to the memory layers 220 of the memory group MG2 stacked under the Y-decoder layer 242.

Some of the memory layers 220 of the memory groups MG1 through MG4 may share Y-decoder wires and/or the Y-decoder wires may be bit lines. In FIG. 7, first and second memory layers of the memory layers 220 included in each of the memory groups MG1 through MG4 may share a Y-decoder wire and/or third and fourth memory layers of the memory layers 220 may also share a Y-decoder wire. Accordingly, the Y-decoder layer 242 may require two first left connection lines 245L' and/or two second right connection lines 245R' in order to be connected to the memory layers 220 of the memory group MG3 stacked on the Y-decoder layer 242. The Y-decoder layer 242 may require two second left connection lines 245L" and/or two second right connection lines 245R" in order to be connected to the memory layers 220 of the memory group MG2 stacked under the Y-decoder layer 242.

According to example embodiments, some of the memory layers 220 of the memory groups MG1 through MG4 may share X-decoder/Y-decoder wires. The number of connection lines between the X-decoder layer 231/the Y-decoder layer 242 and the memory layers 220 of each of the memory groups MG1 through MG4 may be reduced. Also, the number of memory cells to be decoded by the X-decoder layer 231/the Y-decoder layer 242 may be reduced. Accordingly, the X-decoder layer 231/the Y-decoder layer 242 may reduce complexity and/or may be simply realized.

Also, according to example embodiments, an X-decoder layer and a pair of Y-decoder layers may be alternately interposed between a plurality of memory groups in a stacked memory device. The X-decoder layer may be commonly connected to memory groups stacked on and under the X-decoder layer, but the pair of the Y-decoder layers may be separately connected to memory groups stacked on and under the pair of the Y-decoder layers. Furthermore, according to example embodiments, a Y-decoder layer and a pair of X-decoder layers may be alternately interposed between a plurality of memory groups in a stacked memory device. The Y-decoder layer may be commonly connected to memory groups stacked on and under the Y-decoder layer, but the pair of the X-decoder layers may be separately connected to memory groups stacked on and under the pair of the X-decoder layers.

Figure 8:
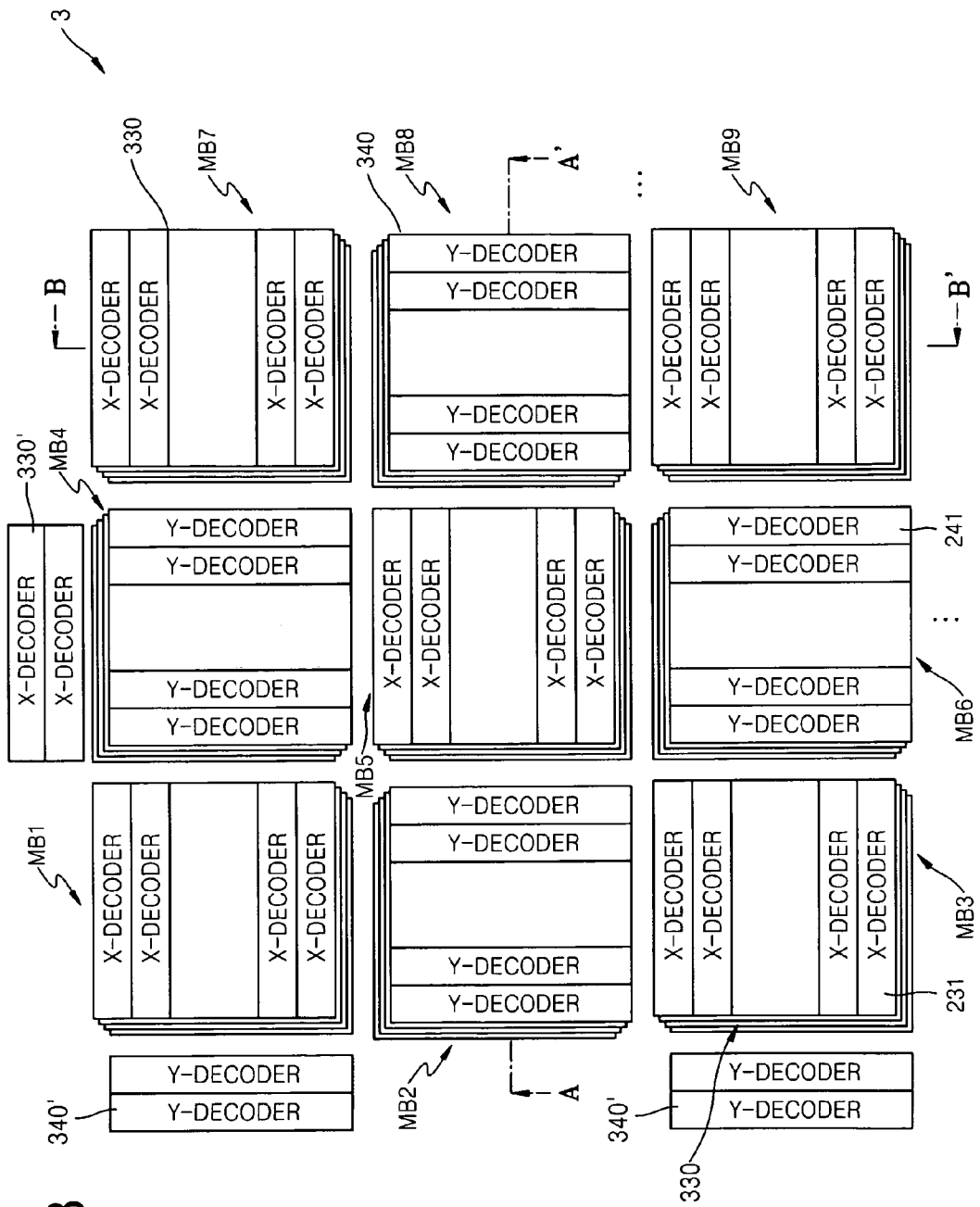
FIG. 8 is a plan view of a stacked memory device according to example embodiments.

FIG. 8 is a plan view of a stacked memory device 3 according to example embodiments.

Referring to FIG. 8, the stacked memory device 3 may include a plurality of memory blocks, e.g., first through ninth memory blocks MB1 through MB9, on a substrate (not shown). Although nine memory blocks MB1 through MB9 are illustrated in FIG. 8 for convenience, the stacked memory device 3 may include a larger number of memory blocks.

Each of the first through ninth memory blocks MB1 through MB9 may include a plurality of memory layers and a plurality of decoder layers, and/or a decoder layer disposed at a certain level of each of the first through ninth memory blocks MB1 through MB9 may be alternately disposed with decoder layers disposed at the same level of neighboring memory blocks. In more detail, if an X-decoder layer 330 is disposed at a certain level of each of the first through ninth memory blocks MB1 through MB9, Y-decoder layers 340 may be disposed at the same level of neighboring memory blocks. As such, X-decoder and Y-decoder layers 330 and 340 may form a grid structure at the same level of the first through ninth memory blocks MB1 through MB9.

Memory cells of memory layers of the first through ninth memory blocks MB1 through MB9 may be grouped into first and second groups. Here, each of the X-decoder layers 330 may include a plurality of X-decoder arrays. The X-decoder arrays may be similar to the X-decoder array 131A illustrated in FIG. 2. Also, each of the Y-decoder layers 340 may include a plurality of Y-decoder arrays. The Y-decoder arrays may be similar to the Y-decoder array 142A illustrated in FIG. 3.

In more detail, the first and second groups in the memory layers of the second memory block MB2 may be connected to the Y-decoder layer 340 of the second memory block MB2, the first group in the memory layers of the second memory block MB2 may be connected to the X-decoder layer 330 of the first memory block MB1, and/or the second group in the memory layers of the second memory block MB2 may be connected to the X-decoder layer 330 of the third memory block MB3. As such, memory layers of one memory block may be connected to a decoder layer of the memory block and/or decoder layers of neighboring memory blocks so as to decode X-axis and Y-axis address information required to operate the memory layers.

Meanwhile, the first and second groups in the memory layers of the first memory block MB1 may be connected to the X-decoder layer 330 of the first memory block MB1, the first group in the memory layers of the first memory block MB1 may be connected to the Y-decoder layer 340 of the fourth memory block MB4, and/or the second group in the memory layers of the first memory block MB1 may be connected to a Y-decoder layer 340' disposed at the left of the first memory block MB1. The first and second groups in the memory layers of the fourth memory block MB4 may be connected to the Y-decoder layer 340 of the fourth memory block MB4, the first group in the memory layers of the fourth memory block MB4 may be connected to the X-decoder layer 330 of the fifth memory block MB5, and/or the second group in the memory layers of the fourth memory block MB4 may be connected to an X-decoder layer 330' disposed at the top of the fourth memory block MB4. As such, in the stacked memory device 3, outermost memory blocks having a shortage of neighboring memory blocks may require additional decoder layers, such as the X-decoder and Y-decoder layers 330' and 340', in order to receive X-axis and Y-axis address information.

Figure 9:
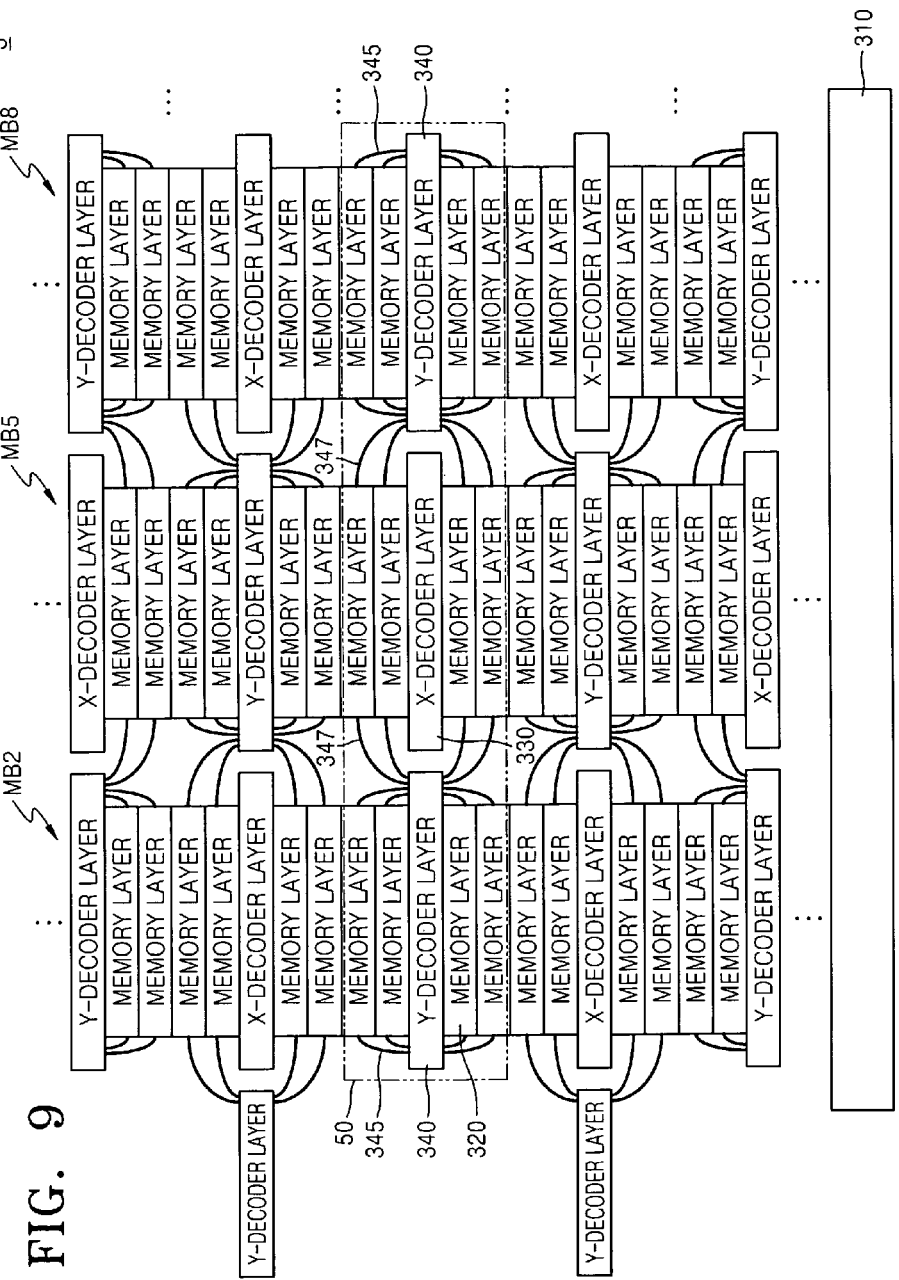
FIG. 9 is a cross-sectional view taken along a line A-A' of the stacked memory device illustrated in FIG. 8, according to example embodiments.
Figure 10:
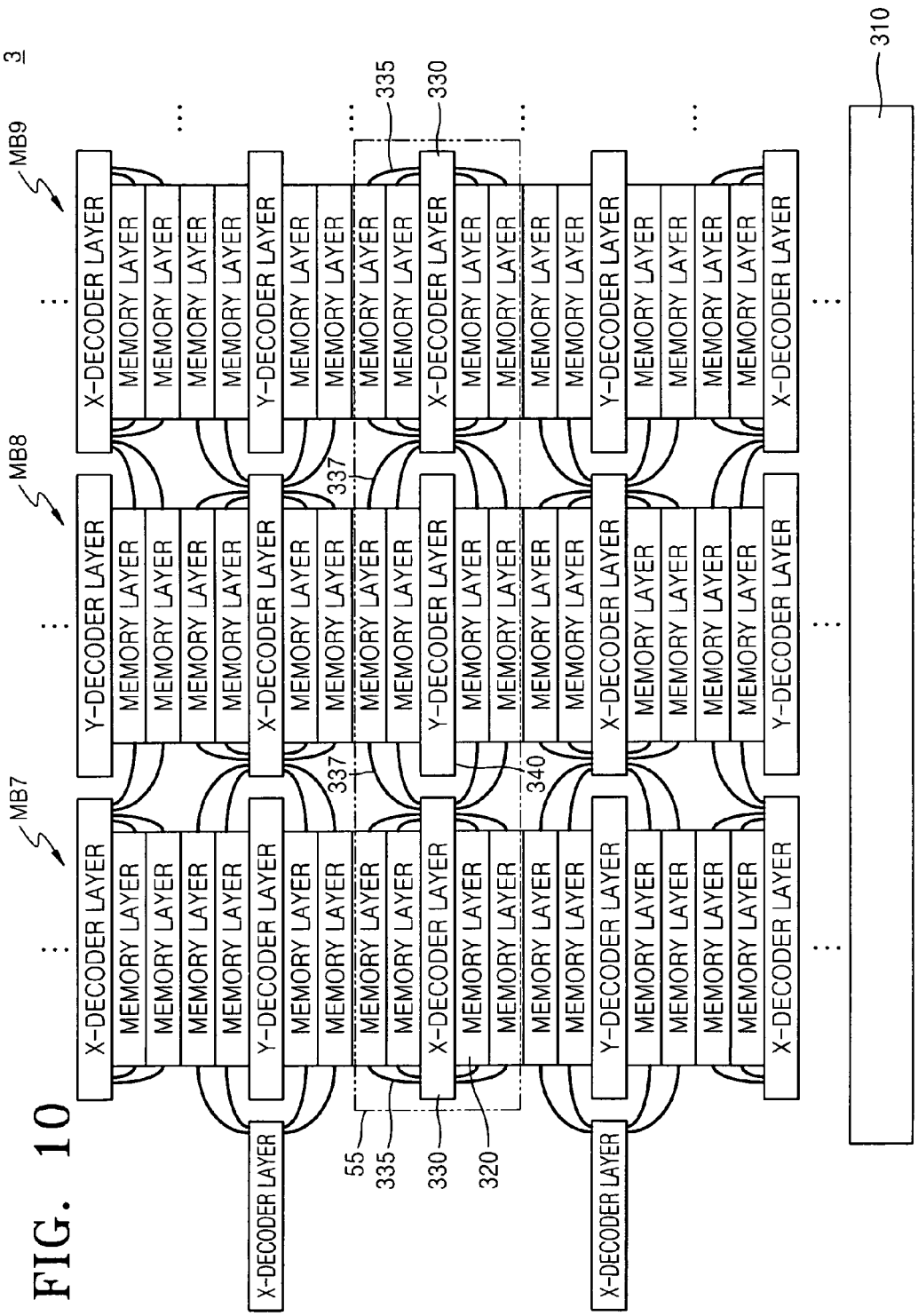
FIG. 10 is a cross-sectional view taken along a line B-B' of the stacked memory device illustrated in FIG. 8, according to example embodiments.

FIG. 9 is a cross-sectional view taken along a line A-A' of the stacked memory device 3 illustrated in FIG. 8, according to example embodiments. FIG. 10 is a cross-sectional view taken along a line B-B' of the stacked memory device 3 illustrated in FIG. 8, according to example embodiments.

Referring to FIGS. 9 and 10, second, fifth, and eighth memory blocks MB2, MB5, and MB8 may be sequentially disposed in a direction of the line A-A' and/or seventh, eighth, and ninth memory blocks MB7, MB8, and MB9 may be sequentially disposed in a direction of the line B-B' on a substrate 310. Here, each of the second, fifth, seventh, eighth, and ninth memory blocks MB2, MB5, MB7, MB8, and MB9 may correspond to the stacked memory device 1 illustrated in FIG. 1. In the stacked memory device 3, a plurality of first basic stacked structures 50 and/or a plurality of second basic stacked structures 55 may be repeatedly formed on the substrate 310. Meanwhile, for better understanding, X-decoder connection lines are omitted in FIG. 9 and Y-decoder connection lines are omitted in FIG. 10. A combination of Y-decoder connections illustrated in FIG. 9 and X-decoder connections illustrated in FIG. 10 forms an overall structure of the stacked memory device 3.

Initially, a memory structure regarding a Y-decoder connection structure will now be described with reference to FIG. 9.

A first basic stacked structure 50 may include Y-decoder layers 340 and an X-decoder layer 330 that are alternately disposed at the same level. Memory layers 320 may be sequentially disposed on and under each of the X-decoder and Y-decoder layers 330 and 340. In more detail, the first basic stacked structure 50 may include the Y-decoder layer 340 of the second memory block MB2 and/or the memory layers 320 sequentially disposed on and under the Y-decoder layer 340, the X-decoder layer 330 of the fifth memory block MB5 and/or the memory layers 320 sequentially disposed on and under the X-decoder layer 330, and/or the Y-decoder layer 340 of the eighth memory block MB8 and/or the memory layers 320 sequentially disposed on and under the Y-decoder layer 340. In FIG. 9, two memory layers 320 may be separately disposed on and under each of the X-decoder and Y-decoder layers 330 and 340 in the first basic stacked structure 50.

In the first basic stacked structure 50, the Y-decoder layer 340 may be disposed between the memory layers 320 of each of the second and eighth memory blocks MB2 and MB8, and/or the X-decoder layer 330 is disposed between the memory layers 320 of the fifth memory block MB5. The memory layers 320 of each of the second and eighth memory blocks MB2 and MB8 may be connected to the Y-decoder layer 340 so as to receive Y-axis address information. The memory layers 320 of the fifth memory block MB5 may be connected to the Y-decoder layers 340 of neighboring memory blocks, i.e., the second and eighth memory blocks MB2 and MB8, so as to receive the Y-axis address information.

In more detail, first and second groups in the memory layers 320 of the second memory block MB2 may be connected through first connection lines 345 to the Y-decoder layer 340 of the second memory block MB2, and/or the first and second groups in the memory layers 320 of the eighth memory block MB8 may be connected through the first connection lines 345 to the Y-decoder layer 340 of the eighth memory block MB8. In the memory layers 320 of the fifth memory block MB5, the first group may be connected through second connection lines 347 to the Y-decoder layer 340 of the second memory block MB2, and/or the second group may be connected through the second connection lines 347 to the Y-decoder layer 340 of the eighth memory block MB8.

A memory structure regarding an X-decoder connection structure will now be described with reference to FIG. 10.

A second basic stacked structure 55 may include X-decoder layers 330 and a Y-decoder layer 340 that are alternately disposed at the same level. Memory layers 320 may be sequentially disposed on and under each of the X-decoder layers 330 and the Y-decoder layer 340. In more detail, the second basic stacked structure 55 may include the X-decoder layer 330 of the seventh memory block MB7 and/or the memory layers 320 sequentially disposed on and under the X-decoder layer 330, the Y-decoder layer 340 of the eighth memory block MB8 and/or the memory layers 320 sequentially disposed on and under the Y-decoder layer 340, and/or the X-decoder layer 330 of the ninth memory block MB9 and/or the memory layers 320 sequentially disposed on and under the X-decoder layer 330. In FIG. 10, two memory layers 320 may be separately disposed on and under each of the X-decoder and Y-decoder layers 330 and 340 in the second basic stacked structure 55.

In the second basic stacked structure 55, the X-decoder layer 330 may be disposed between the memory layers 320 of each of the seventh and ninth memory blocks MB7 and MB9, and/or the Y-decoder layer 340 may be disposed between the memory layers 320 of the eighth memory block MB8. The memory layers 320 of each of the seventh and ninth memory blocks MB7 and MB9 may be connected to the X-decoder layer 330 so as to receive X-axis address information. The memory layers 320 of the eighth memory block MB8 may be connected to the X-decoder layers 330 of neighboring memory blocks, i.e., the seventh and ninth memory blocks MB7 and MB9, so as to receive the X-axis address information.

In more detail, first and second groups in the memory layers 320 of the seventh memory block MB7 may be connected through third connection lines 335 to the X-decoder layer 330 of the seventh memory block MB7, and/or the first and second groups in the memory layers 320 of the ninth memory block MB9 may be connected through the third connection lines 335 to the X-decoder layer 330 of the ninth memory block MB9. In the memory layers 320 of the eighth memory block MB8, the first group may be connected through fourth connection lines 337 to the X-decoder layer 330 of the seventh memory block MB7, and/or the second group may be connected through the fourth connection lines 337 to the X-decoder layer 330 of the ninth memory block MB9.

In FIGS. 9 and 10, X-decoder and Y-decoder layers may be alternately interposed between a plurality of memory groups in a memory block and may also be alternately interposed between a plurality of memory blocks at the same level. As such, an X-decoder layer of each memory block may be surrounded by Y-decoder layers disposed at the same level of neighboring memory blocks. Likewise, a Y-decoder layer of each memory block may be surrounded by X-decoder layers disposed at the same level of neighboring memory blocks. Accordingly, X-decoder and Y-decoder layers may be alternately disposed across memory blocks at the same level on the substrate 310.

According to example embodiments, in the first or second basic stacked structure 50 or 55, the memory layers 320 of one memory block may be connected to a decoder layer of the memory block and/or decoder layers may be disposed at the same level of neighboring memory blocks. Accordingly, connection lines may be shortened such that signal interference may be reduced and/or connection efficiency may be improved.

Since memory cells of the memory layers 320 may be grouped into two groups, in the first or second basic stacked structure 50 or 55, each of the X-decoder and Y-decoder layers 330 and 340 may include a plurality of decoder pairs corresponding to a half of the number of memory layers 320 of each memory block. As a pair of decoders may be connected through a pair of connection lines to the memory layers 320, the memory cells of the memory layers 320 may be grouped into two groups so as to be decoded. Accordingly, the decoders of each of the X-decoder and Y-decoder layers 330 and 340 may reduce complexity and/or may increase the integration efficiency of the stacked memory device 3.

Figure 11:
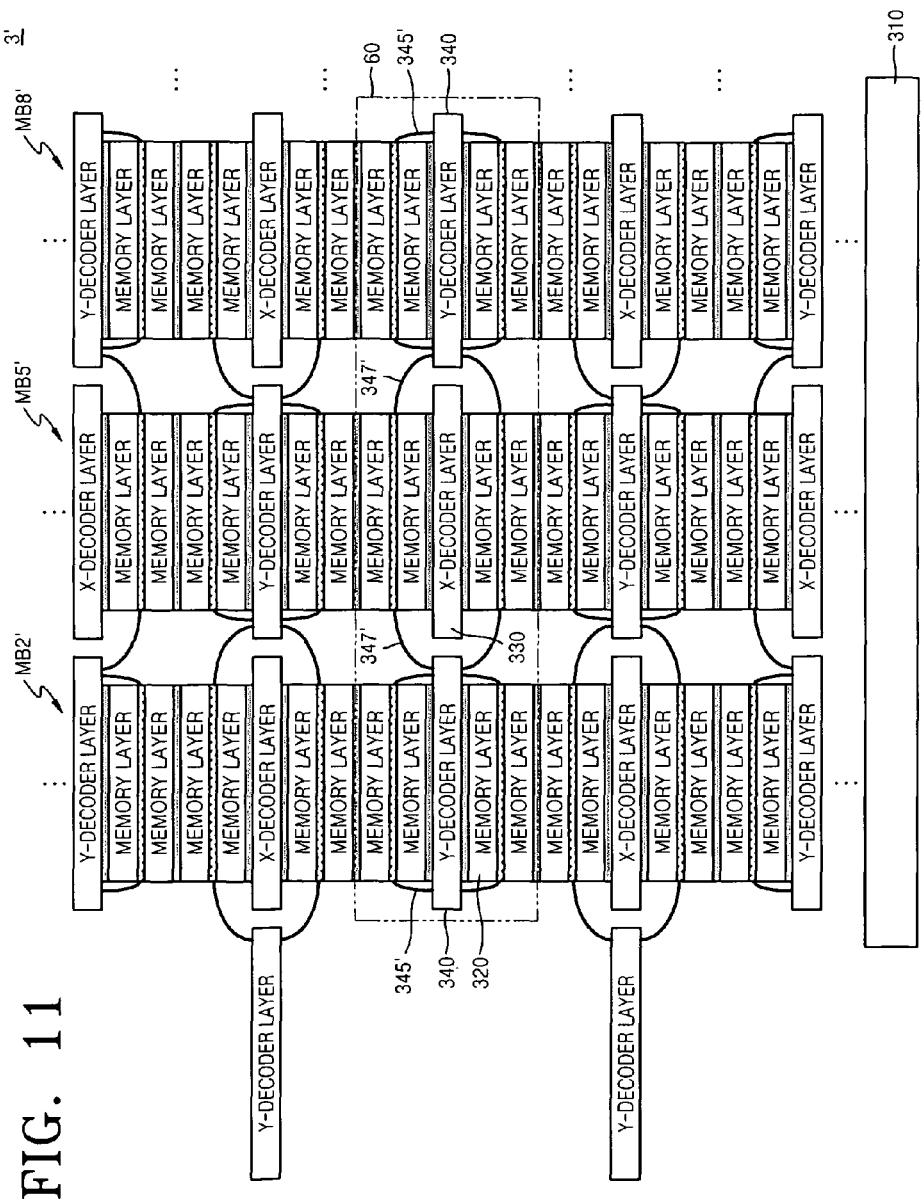
FIG. 11 is a cross-sectional view taken along a line A-A' of the stacked memory device illustrated in FIG. 8, according to example embodiments.
Figure 12:
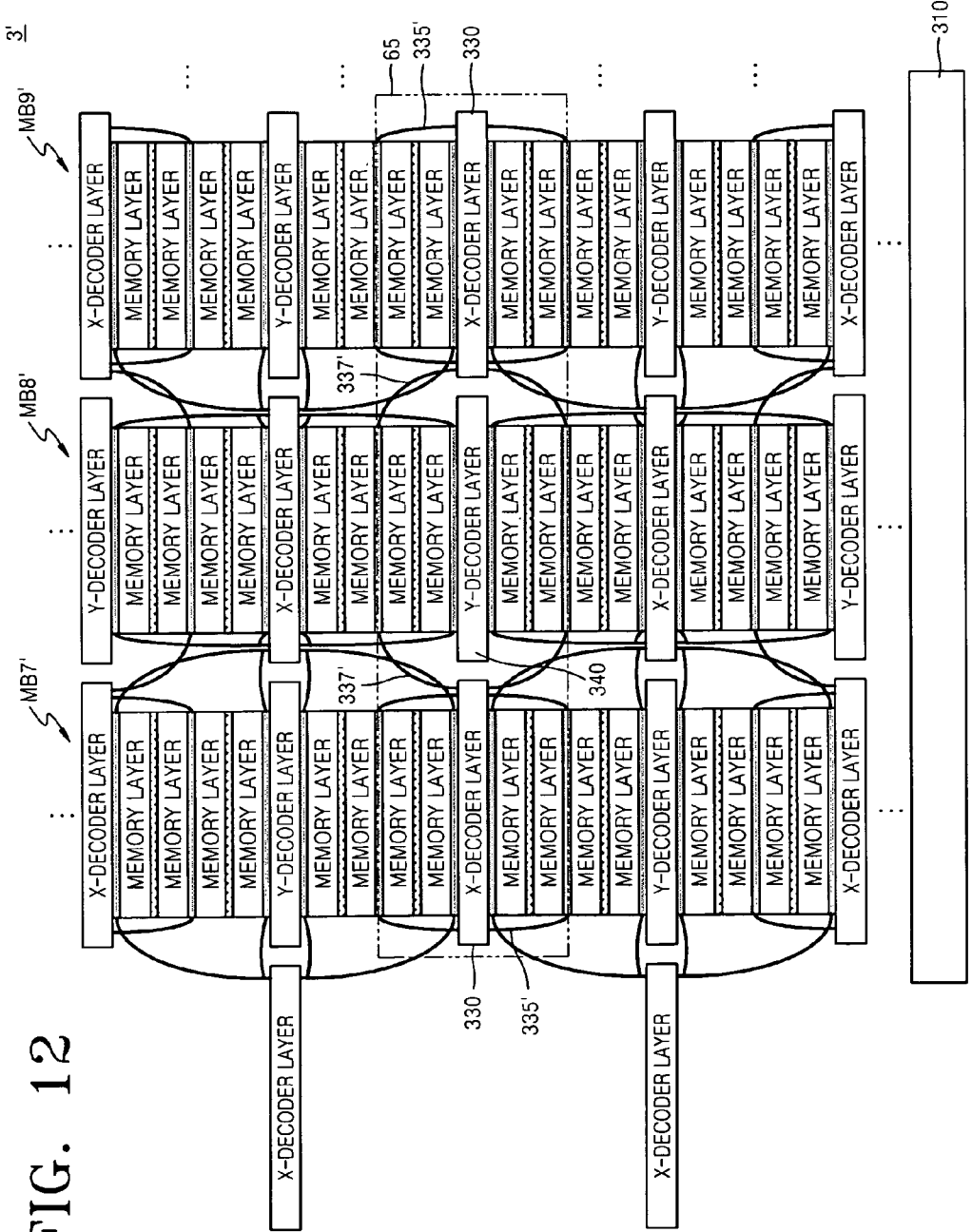
FIG. 12 is a cross-sectional view taken along a line B-B' of the stacked memory device illustrated in FIG. 8, according to example embodiments.

FIG. 11 is a cross-sectional view taken along a line A-A' of the stacked memory device 3 illustrated in FIG. 8, according to example embodiments. FIG. 12 is a cross-sectional view taken along a line B-B' of the stacked memory device 3 illustrated in FIG. 8, according to example embodiments.

Referring to FIGS. 11 and 12, second, fifth, and eighth memory blocks MB2', MB5', and MB8' may be sequentially disposed in a direction of the line A-A', and seventh, eighth, and ninth memory blocks MB7', MB8', and MB9' may be sequentially disposed in a direction of the line B-B' on a substrate 310. Here, each of the second, fifth, seventh, eighth, and ninth memory blocks MB2', MB5', MB7', MB8', and MB9' may correspond to the stacked memory device 2 illustrated in FIG. 7. In the stacked memory device 3', a plurality of first basic stacked structures 60 and/or a plurality of second basic stacked structures 65 may be repeatedly formed on the substrate 310. Meanwhile, for better understanding, X-decoder connection lines are omitted in FIG. 11 and Y-decoder connection lines are omitted in FIG. 12. A combination of Y-decoder connections illustrated in FIG. 11 and X-decoder connections illustrated in FIG. 12 forms an overall structure of the stacked memory device 3'.

Initially, a memory structure regarding a Y-decoder connection structure will now be described with reference to FIG. 11.

A first basic stacked structure 60 may include Y-decoder layers 340 and an X-decoder layer 330 that are alternately disposed at the same level, and memory layers 320 sequentially disposed on and under each of the X-decoder and Y-decoder layers 330 and 340. In more detail, the first basic stacked structure 60 may include the Y-decoder layer 340 of the second memory block MB2' and/or the memory layers 320 sequentially disposed on and under the Y-decoder layer 340, the X-decoder layer 330 of the fifth memory block MB5' and/or the memory layers 320 sequentially disposed on and under the X-decoder layer 330, and/or the Y-decoder layer 340 of the eighth memory block MB8' and/or the memory layers 320 sequentially disposed on and under the Y-decoder layer 340. In FIG. 11, two memory layers 320 may be separately disposed on and under each of the X-decoder and Y-decoder layers 330 and 340 in the first basic stacked structure 60.

In the first basic stacked structure 60, the Y-decoder layer 340 may be disposed between the memory layers 320 of each of the second and eighth memory blocks MB2' and MB8', and/or the X-decoder layer 330 may be disposed between the memory layers 320 of the fifth memory block MB5'. The memory layers 320 of each of the second and eighth memory blocks MB2' and MB8' may be connected to the Y-decoder layer 340 so as to receive Y-axis address information, and/or the memory layers 320 of the fifth memory block MB5' may be connected to the Y-decoder layers 340 of neighboring memory blocks, i.e., the second and eighth memory blocks MB2' and MB8', so as to receive the Y-axis address information.

In more detail, first and second groups in the memory layers 320 of the second memory block MB2' may be connected through first connection lines 345' to the Y-decoder layer 340 of the second memory block MB2', and/or the first and second groups in the memory layers 320 of the eighth memory block MB8' may be connected through the first connection lines 345' to the Y-decoder layer 340 of the eighth memory block MB8'. In the memory layers 320 of the fifth memory block MB5', the first group may be connected through second connection lines 347' to the Y-decoder layer 340 of the second memory block MB2', and/or the second group may be connected through the second connection lines 347' to the Y-decoder layer 340 of the eighth memory block MB8'.

In this case, first and second memory layers 320 may share a Y-decoder wire and/or third and fourth memory layers 320 may also share a Y-decoder wire in each memory group. Accordingly, the Y-decoder layer 340 of the second memory block MB2' may be commonly connected through a pair of first connection lines 345' to a Y-decoder wire between the memory layers 320 disposed on the Y-decoder layer 340 and/or may be commonly connected through another pair of first connection lines 345' to a Y-decoder wire between the memory layers 320 disposed under the Y-decoder layer 340. The Y-decoder layer 340 of the second memory block MB2' may be commonly connected through one second connection line 347' to a Y-decoder wire between the memory layers 320 disposed on the X-decoder layer 330 of the fifth memory block MB5' and/or may be commonly connected through another second connection line 347' to a Y-decoder wire between the memory layers 320 disposed under the X-decoder layer 330. The Y-decoder layer 340 of the eighth memory block MB8' may be commonly connected through one second connection line 347' to a Y-decoder wire between the memory layers 320 disposed on the X-decoder layer 330 of the fifth memory block MB5' and/or may be commonly connected through another second connection line 347' to a Y-decoder wire between the memory layers 320 disposed under the X-decoder layer 330.

Then, a memory structure regarding an X-decoder connection structure will now be described with reference to FIG. 12.

A second basic stacked structure 65 may include X-decoder layers 330 and a Y-decoder layer 340 that are alternately disposed at the same level, and/or memory layers 320 sequentially disposed on and under each of the X-decoder layers 330 and the Y-decoder layer 340. In more detail, the second basic stacked structure 65 may include the X-decoder layer 330 of the seventh memory block MB7' and/or the memory layers 320 sequentially disposed on and under the X-decoder layer 330, the Y-decoder layer 340 of the eighth memory block MB8' and/or the memory layers 320 sequentially disposed on and under the Y-decoder layer 340, and/or the X-decoder layer 330 of the ninth memory block MB9' and/or the memory layers 320 sequentially disposed on and under the X-decoder layer 330. In FIG. 12, two memory layers 320 may be separately disposed on and under each of the X-decoder and Y-decoder layers 330 and 340 in the second basic stacked structure 65.

In the second basic stacked structure 65, the X-decoder layer 330 may be disposed between the memory layers 320 of each of the seventh and ninth memory blocks MB7' and MB9', and/or the Y-decoder layer 340 is disposed between the memory layers 320 of the eighth memory block MB8'. Accordingly, the memory layers 320 of each of the seventh and ninth memory blocks MB7' and MB9' may be connected to the X-decoder layer 330 so as to receive X-axis address information, and/or the memory layers 320 of the eighth memory block MB8' may be connected to the X-decoder layers 330 of neighboring memory blocks, i.e., the seventh and ninth memory blocks MB7' and MB9', so as to receive the X-axis address information.

In more detail, first and second groups in the memory layers 320 of the seventh memory block MB7' may be connected through third connection lines 335' to the X-decoder layer 330 of the seventh memory block MB7', and/or the first and second groups in the memory layers 320 of the ninth memory block MB9' may be connected through the third connection lines 335' to the X-decoder layer 330 of the ninth memory block MB9'. In the memory layers 320 of the eighth memory block MB8', the first group may be connected through fourth connection lines 337' to the X-decoder layer 330 of the seventh memory block MB7', and/or the second group may be connected through the fourth connection lines 337' to the X-decoder layer 330 of the ninth memory block MB9'.

In this case, second and third memory layers 320 may share an X-decoder wire in each memory group. Accordingly, the X-decoder layer 330 of the seventh memory block MB7' may be commonly connected through a pair of third connection lines 335' to an X-decoder wire between the second and third memory layers 320 disposed on the X-decoder layer 330 and/or may be commonly connected through another pair of third connection lines 335' to an X-decoder wire between the second and third memory layers 320 disposed under the X-decoder layer 330. The X-decoder layer 330 of the seventh memory block MB7' may be commonly connected through one fourth connection line 337' to an X-decoder wire between the second and third memory layers 320 disposed on the Y-decoder layer 340 of the eighth memory block MB8' and/or may be commonly connected through another fourth connection line 337' to an X-decoder wire between the second and third memory layers 320 disposed under the Y-decoder layer 340 of the eighth memory block MB8'. The X-decoder layer 330 of the ninth memory block MB9' may be commonly connected through one fourth connection line 337' to an X-decoder wire between the second and third memory layers 320 disposed on the Y-decoder layer 340 of the eighth memory block MB8' and may be commonly connected through another fourth connection line 337' to an X-decoder wire between the second and third memory layers 320 disposed under the Y-decoder layer 340.

Although not shown in FIG. 12, in the second basic stacked structure 65, the memory layers 320 of the seventh and ninth memory blocks MB7' and MB9' may receive Y-axis address information from Y-decoder layers of memory blocks (not shown) disposed at the back of the seventh and ninth memory blocks MB7' and MB9'.

In FIGS. 11 and 12, X-decoder and Y-decoder layers may be alternately interposed between a plurality of memory groups in a memory block and/or may be alternately interposed between a plurality of memory blocks at the same level. As such, an X-decoder layer of each memory block may be surrounded by Y-decoder layers disposed at the same level of neighboring memory blocks. Likewise, a Y-decoder layer of each memory block may be surrounded by X-decoder layers disposed at the same level of neighboring memory blocks. Accordingly, X-decoder and Y-decoder layers may be alternately disposed across memory blocks at the same level on the substrate 310.

According to example embodiments, in the first or second basic stacked structure 60 or 65, the memory layers 320 of one memory block may be connected to a decoder layer of the memory block and decoder layers disposed at the same level of neighboring memory blocks. Accordingly, connection lines may be shortened such that signal interference may be reduced and connection efficiency may be improved.

Also, since memory cells of the memory layers 320 may be grouped into two groups, in the first or second basic stacked structure 60 or 65, each of the X-decoder and Y-decoder layers 330 and 340 may include a plurality of decoder pairs corresponding to a half of the number of memory layers 320 of each memory block. As a pair of decoders are connected through a pair of connection lines to the memory layers 320, the memory cells of the memory layers 320 may be grouped into two groups so as to be decoded. Accordingly, the decoders of each of the X-decoder and Y-decoder layers 330 and 340 may reduce complexity and/or may increase the integration efficiency of the stacked memory device 3'.

Figure 13:
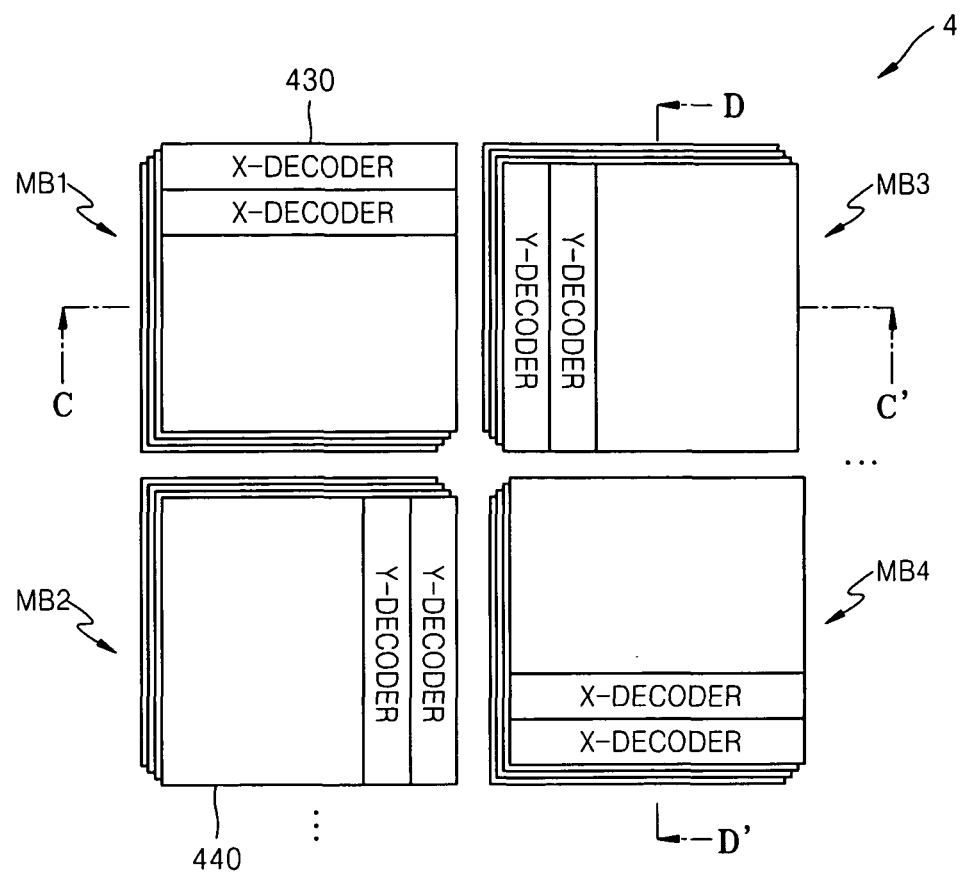
FIG. 13 is a plan view of a stacked memory device according to example embodiments.

FIG. 13 is a plan view of a stacked memory device 4 according to example embodiments.

Referring to FIG. 13, the stacked memory device 4 may include a plurality of memory blocks, e.g., first through fourth memory blocks MB1 through MB4, on a substrate (not shown). Although four memory blocks MB1 through MB4 are illustrated in FIG. 13 for convenience, the stacked memory device 4 may include a larger number of memory blocks. The stacked memory device 4 may be partially modified from the stacked memory device 3 illustrated in FIG. 8 and thus repeated descriptions will not be provided here.

Each of the first through fourth memory blocks MB1 through MB4 may include a plurality of memory layers and a plurality of decoder layers, and/or a decoder layer disposed at a certain level of each of the first through fourth memory blocks MB1 through MB4 may be alternately disposed with decoder layers disposed at the same level of neighboring memory blocks. In more detail, if an X-decoder layer 430 may be disposed at a certain level of each of the first through fourth memory blocks MB1 through MB4, Y-decoder layers 440 may be disposed at the same level of neighboring memory blocks. As such, X-decoder and Y-decoder layers 430 and 440 may form a grid structure at the same level of the first through fourth memory blocks MB1 through MB4.

Here, each of the X-decoder layers 430 may include one or more X-decoder arrays and/or each of the Y-decoder layers 440 may include one or more Y-decoder arrays.

In more detail, memory layers of the first memory block MB1 may be connected to the X-decoder layer 430 of the first memory block MB1 and/or may be connected to the Y-decoder layer 440 of the third memory block MB3. Memory layers of the second memory block MB2 may be connected to the Y-decoder layer 440 of the second memory block MB2 and/or may be connected to the X-decoder layer 430 of the fourth memory block MB4. Accordingly, in the stacked memory device 4, even outermost memory blocks having no neighboring memory blocks may not require additional decoder layers in order to receive X-axis and Y-axis address information. As such, an overall area of the stacked memory device 4 may be reduced.

Figure 14:
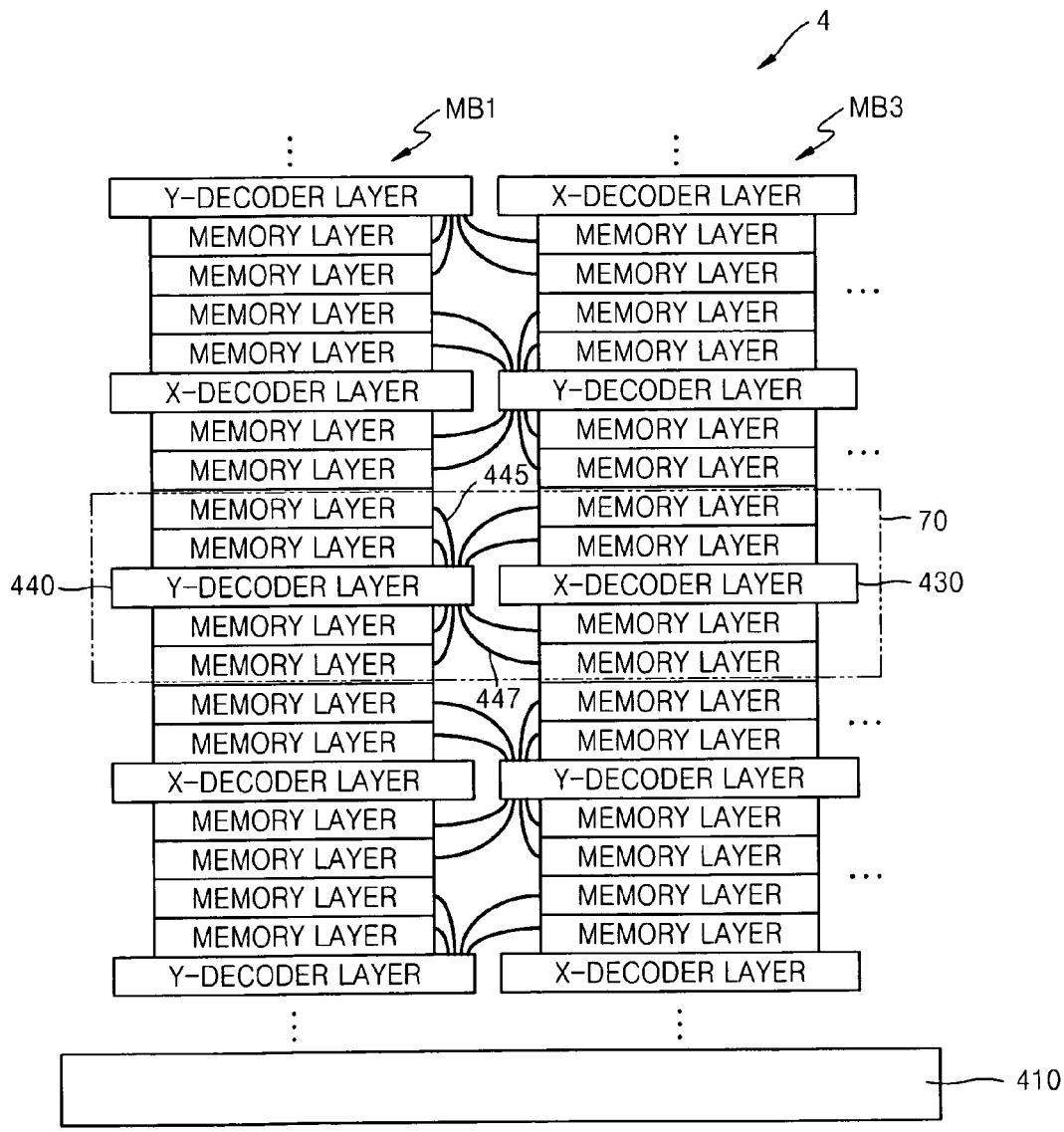
FIG. 14 is a cross-sectional view taken along a line C-C' of the stacked memory device illustrated in FIG. 13, according to example embodiments.
Figure 15:
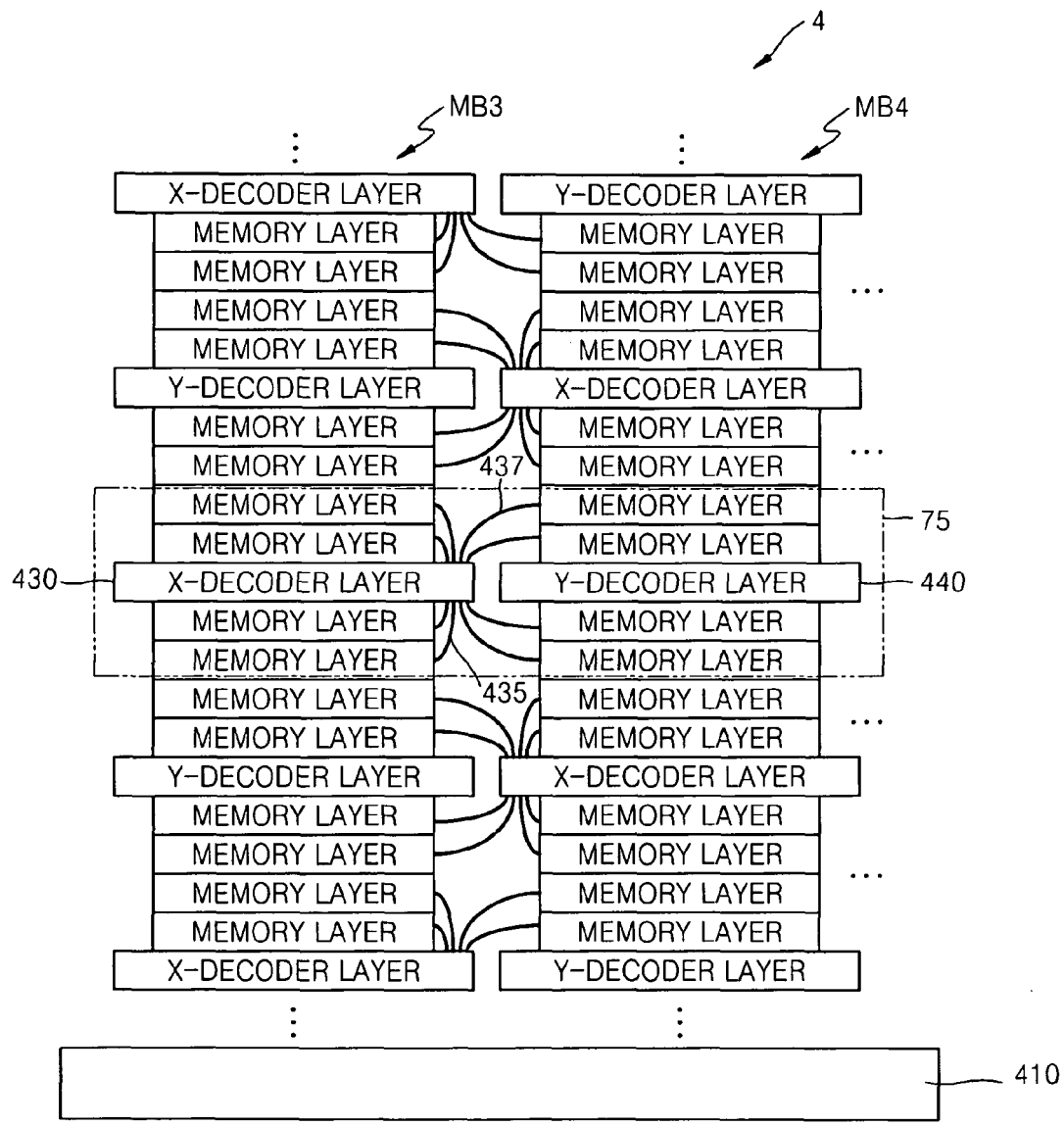
FIG. 15 is a cross-sectional view taken along a line D-D' of the stacked memory device illustrated in FIG. 13, according to example embodiments.

FIG. 14 is a cross-sectional view taken along a line C-C' of the stacked memory device 4 illustrated in FIG. 13, according to example embodiments. FIG. 15 is a cross-sectional view taken along a line D-D' of the stacked memory device 4 illustrated in FIG. 13, according to example embodiments.

Referring to FIGS. 14 and 15, first and third memory blocks MB1 and MB3 may be sequentially disposed in a direction of the line C-C' and/or third and fourth memory blocks MB3 and MB4 may be sequentially disposed in a direction of the line D-D' on a substrate 410. Here, each of the first, third, and fourth memory blocks MB1, MB3, and MB4 may correspond to the stacked memory device 1 illustrated in FIG. 1. In the stacked memory device 4, a plurality of first basic stacked structures 70 and/or a plurality of second basic stacked structures 75 may be repeatedly formed on the substrate 410. Meanwhile, for better understanding, X-decoder connection lines are omitted in FIG. 14 and Y-decoder connection lines are omitted in FIG. 15. A combination of Y-decoder connections illustrated in FIG. 14 and X-decoder connections illustrated in FIG. 15 forms an overall structure of the stacked memory device 4.

Initially, a memory structure regarding a Y-decoder connection structure will now be described with reference to FIG. 14.

A first basic stacked structure 70 may include a Y-decoder layer 440 and an X-decoder layer 430 that are alternately disposed at the same level, and/or memory layers 420 sequentially disposed on and under each of the Y-decoder layer 440 and the X-decoder layer 430. In more detail, the first basic stacked structure 70 may include the Y-decoder layer 440 of the first memory block MB1 and/or the memory layers 420 sequentially disposed on and under the Y-decoder layer 440, and/or the X-decoder layer 430 of the third memory block MB3 and/or the memory layers 420 sequentially disposed on and under the X-decoder layer 430. In FIG. 14, two memory layers 420 may be separately disposed on and under each of the X-decoder and Y-decoder layers 430 and 440 in the first basic stacked structure 70.

In the first basic stacked structure 70, the Y-decoder layer 440 may be disposed between the memory layers 420 of the first memory block MB1, and/or the X-decoder layer 430 may be disposed between the memory layers 420 of the third memory block MB3. Accordingly, the memory layers 420 of the first memory block MB1 may be connected to the Y-decoder layer 440 so as to receive Y-axis address information, and/or the memory layers 420 of the third memory block MB3 may be connected to the Y-decoder layer 440 of a neighboring memory block, i.e., the first memory block MB1, so as to receive the Y-axis address information.

In more detail, the memory layers 420 of the first memory block MB1 may be connected through first connection lines 445 to the Y-decoder layer 440 of the first memory block MB1, and/or the memory layers 420 of the third memory block MB3 may be connected through second connection lines 447 to the Y-decoder layer 440 of the first memory block MB1.

Then, a memory structure regarding an X-decoder connection structure will now be described with reference to FIG. 15.

A second basic stacked structure 75 may include an X-decoder layer 430 and a Y-decoder layer 440 that are alternately disposed at the same level, and/or memory layers 420 sequentially disposed on and under each of the X-decoder layer 430 and the Y-decoder layer 440. In more detail, the second basic stacked structure 75 may include the X-decoder layer 430 of the third memory block MB3 and/or the memory layers 420 sequentially disposed on and under the X-decoder layer 430, and/or the Y-decoder layer 440 of the fourth memory block MB4 and/or the memory layers 420 sequentially disposed on and under the Y-decoder layer 440. In FIG. 15, two memory layers 420 may be separately disposed on and under each of the X-decoder and Y-decoder layers 440 and 430 in the second basic stacked structure 75.

In the second basic stacked structure 75, the X-decoder layer 430 may be disposed between the memory layers 420 of the third memory block MB3, and/or the Y-decoder layer 440 may be disposed between the memory layers 420 of the fourth memory block MB4. Accordingly, the memory layers 420 of the third memory block MB3 may be connected to the X-decoder layer 430 so as to receive X-axis address information, and/or the memory layers 420 of the fourth memory block MB4 may be connected to the X-decoder layer 430 of a neighboring memory block, i.e., the third memory block MB3, so as to receive the X-axis address information.

In more detail, the memory layers 420 of the third memory block MB3 may be connected through third connection lines 435 to the X-decoder layer 430 of the third memory block MB3, and/or the memory layers 420 of the fourth memory block MB4 may be connected through fourth connection lines 437 to the X-decoder layer 430 of the third memory block MB3.

In FIGS. 14 and 15, X-decoder and Y-decoder layers may be alternately interposed between a plurality of memory groups in a memory block and may also be alternately interposed between a plurality of memory blocks at the same level. As such, an X-decoder layer of each memory block may be surrounded by Y-decoder layers disposed at the same level of neighboring memory blocks. Likewise, a Y-decoder layer of each memory block may be surrounded by X-decoder layers disposed at the same level of neighboring memory blocks. Accordingly, X-decoder and Y-decoder layers may be alternately disposed across memory blocks at the same level on the substrate 410.

According to example embodiments, in the first or second basic stacked structure 70 or 75, the memory layers 420 of one memory block may be connected to a decoder layer of the memory block and/or decoder layers disposed at the same level of neighboring memory blocks. Accordingly, connection lines may be shortened such that signal interference may be reduced and connection efficiency may be improved.

Figure 16:
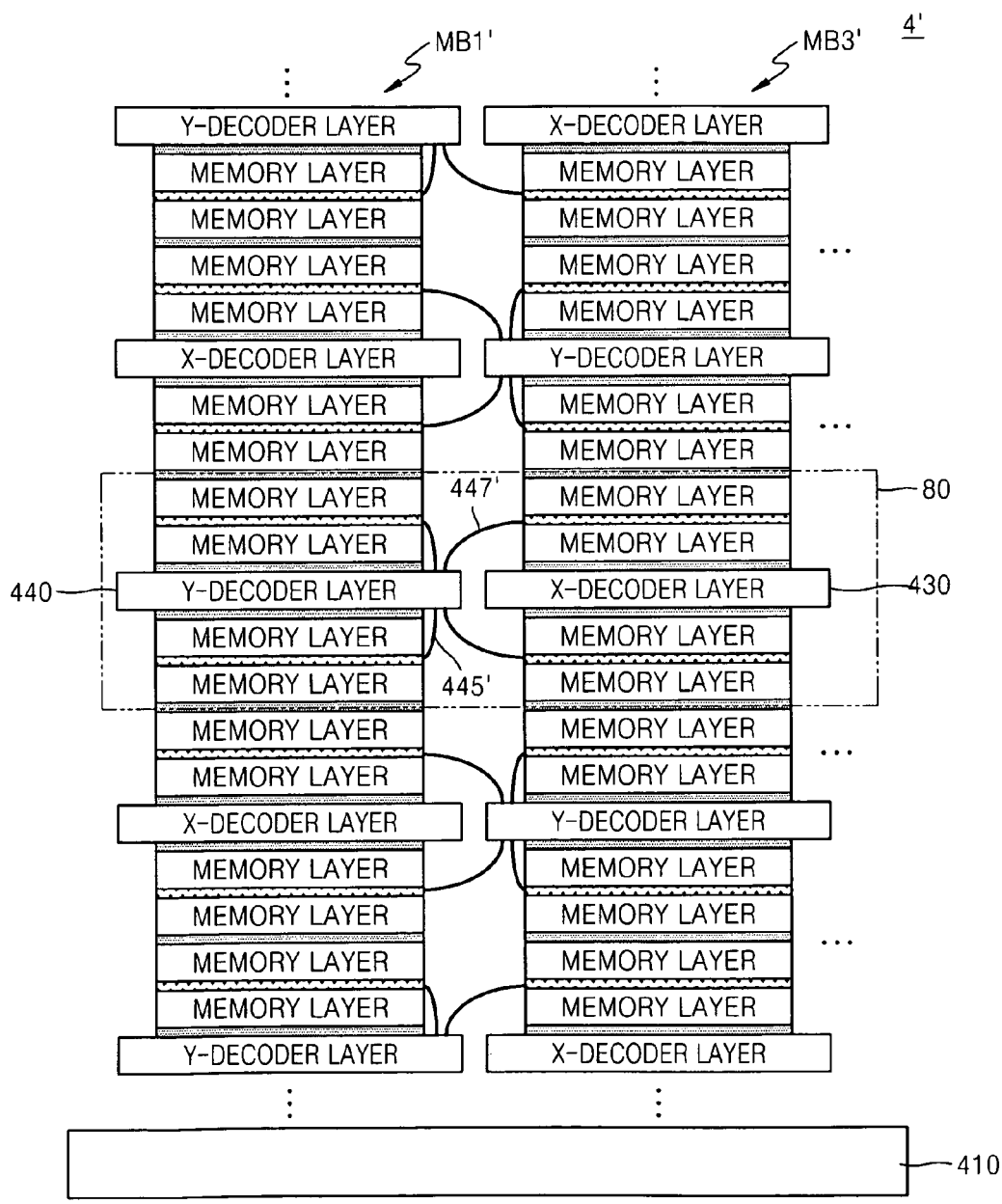
FIG. 16 is a cross-sectional view taken along a line C-C' of the stacked memory device illustrated in FIG. 13, according to example embodiments.
Figure 17:
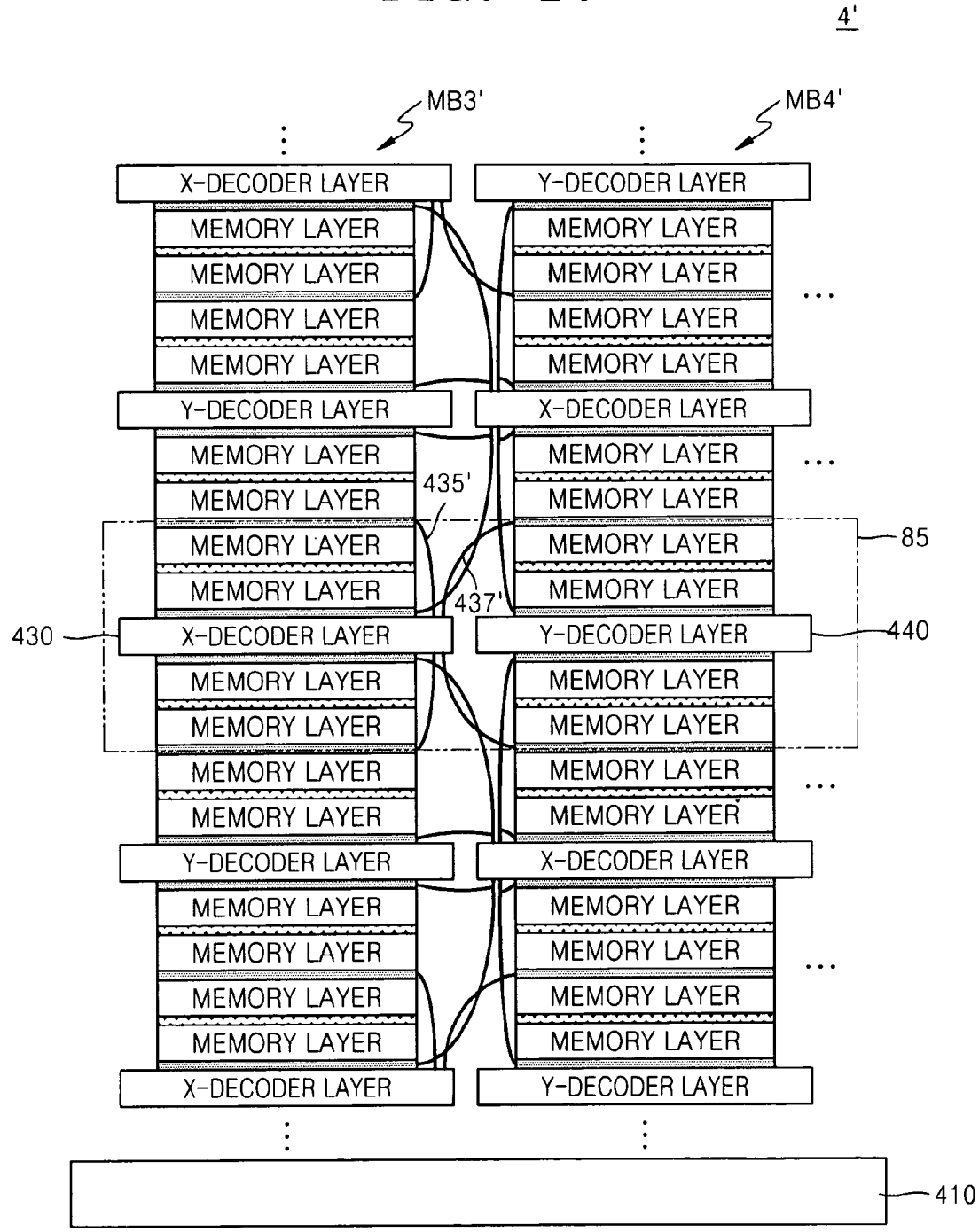
FIG. 17 is a cross-sectional view taken along a line D-D' of the stacked memory device illustrated in FIG. 13, according to example embodiments.

FIG. 16 is a cross-sectional view taken along a line C-C' of the stacked memory device 4 illustrated in FIG. 13, according to example embodiments. FIG. 17 is a cross-sectional view taken along a line D-D' of the stacked memory device 4 illustrated in FIG. 13, according to example embodiments.

Referring to FIGS. 16 and 17, first and third memory blocks MB1' and MB3' may be sequentially disposed in a direction of the line C-C' and/or third and fourth memory blocks MB3' and MB4' may be sequentially disposed in a direction of the line D-D' on a substrate 410. Here, each of the first, third, and fourth memory blocks MB1', MB3', and MB4' may correspond to the stacked memory device 2 illustrated in FIG. 7. In the stacked memory device 4', a plurality of first basic stacked structures 80 and/or a plurality of second basic stacked structures 85 may be repeatedly formed on the substrate 410. Meanwhile, for better understanding, X-decoder connection lines are omitted in FIG. 16 and Y-decoder connection lines are omitted in FIG. 17. A combination of Y-decoder connections illustrated in FIG. 16 and X-decoder connections illustrated in FIG. 17 forms an overall structure of the stacked memory device 4'.

Initially, a memory structure regarding a Y-decoder connection structure will now be described with reference to FIG. 16.

A first basic stacked structure 80 may include a Y-decoder layer 440 and an X-decoder layer 430 that are alternately disposed at the same level, and/or memory layers 420 sequentially disposed on and under each of the X-decoder and Y-decoder layers 430 and 440. In more detail, the first basic stacked structure 80 may include the Y-decoder layer 440 of the first memory block MB1' and/or the memory layers 420 sequentially disposed on and under the Y-decoder layer 440, and/or the X-decoder layer 430 of the third memory block MB3' and/or the memory layers 420 sequentially disposed on and under the X-decoder layer 430. In FIG. 16, two memory layers 420 may be separately disposed on and under each of the X-decoder and Y-decoder layers 430 and 440 in the first basic stacked structure 80.

In the first basic stacked structure 80, the Y-decoder layer 440 may be disposed between the memory layers 420 of the first memory block MB1', and/or the X-decoder layer 430 may be disposed between the memory layers 420 of the third memory block MB3'. Accordingly, the memory layers 420 of the first memory block MB1' may be connected to the Y-decoder layer 440 so as to receive Y-axis address information, and/or the memory layers 420 of the third memory block MB3' may be connected to the Y-decoder layers 440 of a neighboring memory block, i.e., the first memory block MB1', so as to receive the Y-axis address information.

In more detail, the memory layers 420 of the first memory block MB1' may be connected through first connection lines 445' to the Y-decoder layer 440 of the first memory block MB1', and/or the memory layers 420 of the third memory block MB3' may be connected through second connection lines 447' to the Y-decoder layer 440 of the first memory block MB1'.

Although not shown in FIG. 16, second and third memory layers in each memory group of a second memory block MB2' may receive X-axis address information from an X-decoder layer of a memory block (not shown) disposed at the back of the second memory block MB2'. Also, second and third memory layers in each memory group of an eighth memory block MB8' may receive X-axis address information from an X-decoder layer of a memory block (not shown) disposed at the back of the eighth memory block MB8'.

Then, a memory structure regarding an X-decoder connection structure will now be described with reference to FIG. 17.

A second basic stacked structure 85 may include an X-decoder layer 430 and a Y-decoder layer 440 that may be alternately disposed at the same level, and/or memory layers 420 sequentially disposed on and under each of the X-decoder layers 430 and the Y-decoder layer 440. In more detail, the second basic stacked structure 85 may include the X-decoder layer 430 of the third memory block MB3' and/or the memory layers 420 sequentially disposed on and under the X-decoder layer 430, and/or the Y-decoder layer 440 of the fourth memory block MB4' and/or the memory layers 420 sequentially disposed on and under the Y-decoder layer 440. In FIG. 17, two memory layers 420 may be separately disposed on and under each of the X-decoder and Y-decoder layers 430 and 440 in the second basic stacked structure 85.

In the second basic stacked structure 85, the X-decoder layer 430 may be disposed between the memory layers 420 of the third memory block MB3', and the Y-decoder layer 440 may be disposed between the memory layers 420 of the fourth memory block MB4'. Accordingly, the memory layers 420 of the third memory block MB3' may be connected to the X-decoder layer 430 so as to receive X-axis address information, and/or the memory layers 420 of the fourth memory block MB4' may be connected to the X-decoder layers 430 of a neighboring memory block, i.e., the third memory block MB3', so as to receive the X-axis address information.

In more detail, the memory layers 420 of the third memory block MB3' may be connected through third connection lines 435' to the X-decoder layer 430 of the third memory block MB3', and/or the memory layers 420 of the fourth memory block MB4' may be connected through fourth connection lines 437' to the X-decoder layer 430 of the third memory block MB3'.

Although not shown in FIG. 17, in the second basic stacked structure 85, the memory layers 420 of seventh and ninth memory blocks MB7' and MB9' may receive Y-axis address information from Y-decoder layers of memory blocks (not shown) disposed at the back of the seventh and ninth memory blocks MB7' and MB9'.

In FIGS. 16 and 17, X-decoder and Y-decoder layers may be alternately interposed between a plurality of memory groups in a memory block and may also be alternately interposed between a plurality of memory blocks at the same level. As such, an X-decoder layer of each memory block may be surrounded by Y-decoder layers disposed at the same level of neighboring memory blocks. Likewise, a Y-decoder layer of each memory block may be surrounded by X-decoder layers disposed at the same level of neighboring memory blocks. Accordingly, X-decoder and Y-decoder layers may be alternately disposed across memory blocks at the same level on the substrate 410.

According to example embodiments, in the first or second basic stacked structure 80 or 85, the memory layers 420 of one memory block may be connected to a decoder layer of the memory block and decoder layers disposed at the same level of neighboring memory blocks. Accordingly, connection lines may be shortened such that signal interference may be reduced and connection efficiency may be improved.

Figure 18:
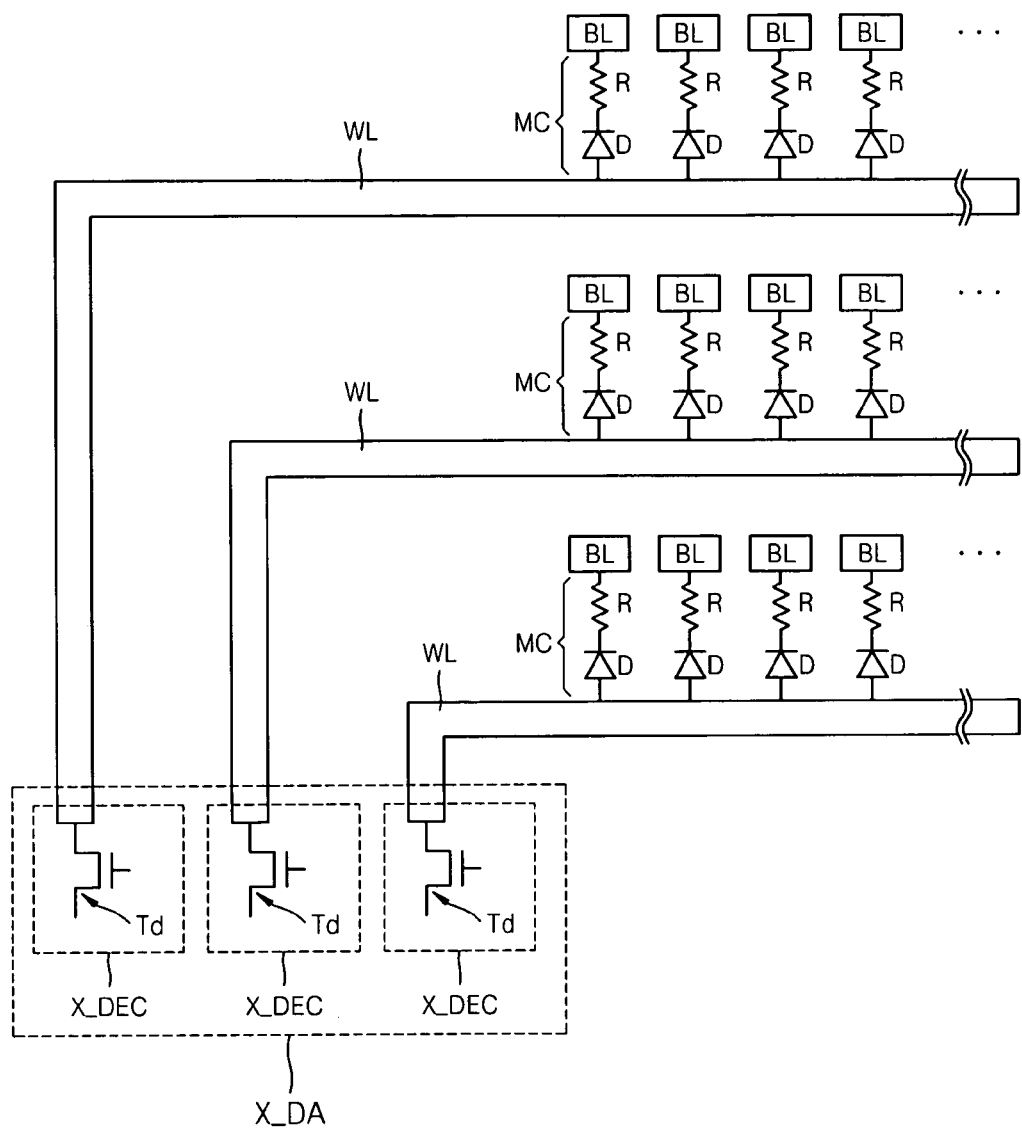
FIGS. 18 through 21 are cross-sectional views showing physical connections between memory layers and an X-decoder array in a stacked memory device, according to example embodiments.

FIG. 18 is a cross-sectional view showing physical connections between memory layers and an X-decoder array X-DA in a stacked memory device, according to example embodiments. The stacked memory devices 1, 1', and 1" illustrated in FIGS. 1 through 6 may be physically realized as illustrated in FIG. 18.

Referring to FIG. 18, a plurality of memory cells MC may be stacked into a plurality of layers, e.g., three layers. For example, each of the memory cells MC may include a variable resistor R and a diode D. The variable resistor R may have a high resistance state and a low resistance state according to an applied voltage and thus may be used as a data storage medium. The memory cells MC of each layer may be arranged in an array structure.

Each of a plurality of word lines WL may extend in a direction so as to be connected to a layer of the memory cells MC. Thus, the layers of the memory cells MC may be connected to different word lines WL. A plurality of bit lines BL may extend to cross the word lines WL. According to example embodiments, one memory cell MC may be connected to a word line WL and/or a bit line BL.

The word lines WL may be connected to the X-decoder array X-DA. The X-decoder array X-DA may include a number of X-decoders X-DEC corresponding to the number of stacked layers of the memory cells MC. Each of the X-decoders X-DEC may include a decoding transistor Td. The X-decoders X-DEC of the X-decoder array X-DA may be connected to the word lines WL in a one-to-one correspondence.

Figure 19:
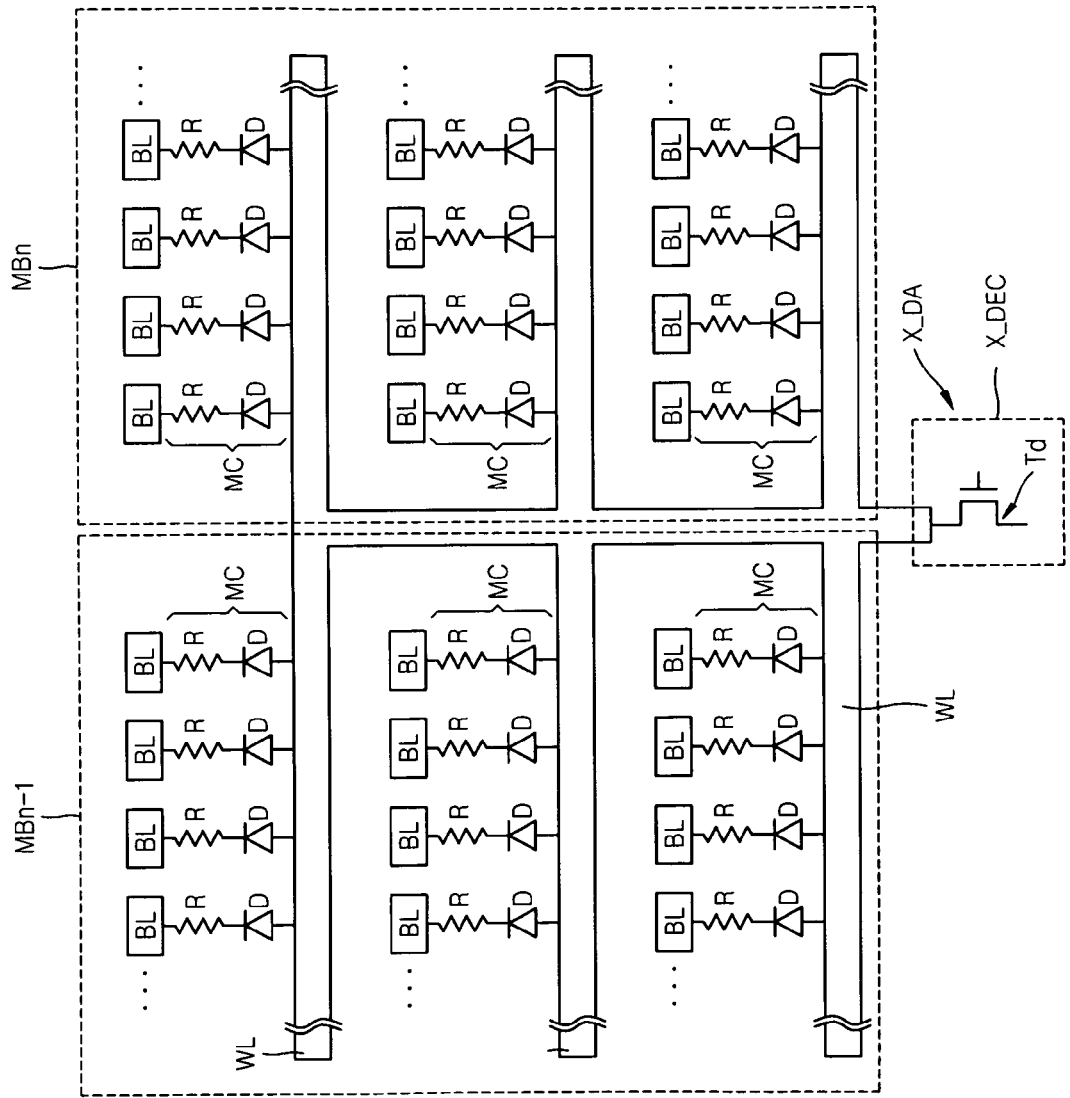

FIG. 19 is a cross-sectional view showing physical connections between memory layers and an X-decoder array X-DA in a stacked memory device, according to example embodiments. The stacked memory devices 3 and 4 illustrated in FIGS. 8 through 10 and 13 through 15 may be physically realized as illustrated in FIG. 19.

Referring to FIG. 19, a plurality of memory cells MC in memory blocks MBn−1 and MBn may be stacked into a plurality of layers, e.g., three layers. The stacked memory device illustrated in FIG. 19 may be partially modified from the stacked memory device FIG. 18 by expanding the stacked memory device in memory blocks and thus repeated descriptions will not be provided here.

Each of a plurality of word lines WL may extend in a direction so as to be connected to a layer of the memory cells MC. A plurality of bit lines BL may extend to cross the word lines WL by interposing the memory cells MC therebetween. In this case, the word lines WL of neighboring memory blocks MBn−1 and MBn may be connected to each other so as to be connected to the X-decoder array X-DA.

The X-decoder array X-DA may include one X-decoder X-DEC and may decode the memory cells MC by using the word lines WL connected to the X-decoder X-DEC. Accordingly, the X-decoder X-DEC may be simply realized and the speed of decoding the memory cells MC may be greatly increased.

Figure 20:
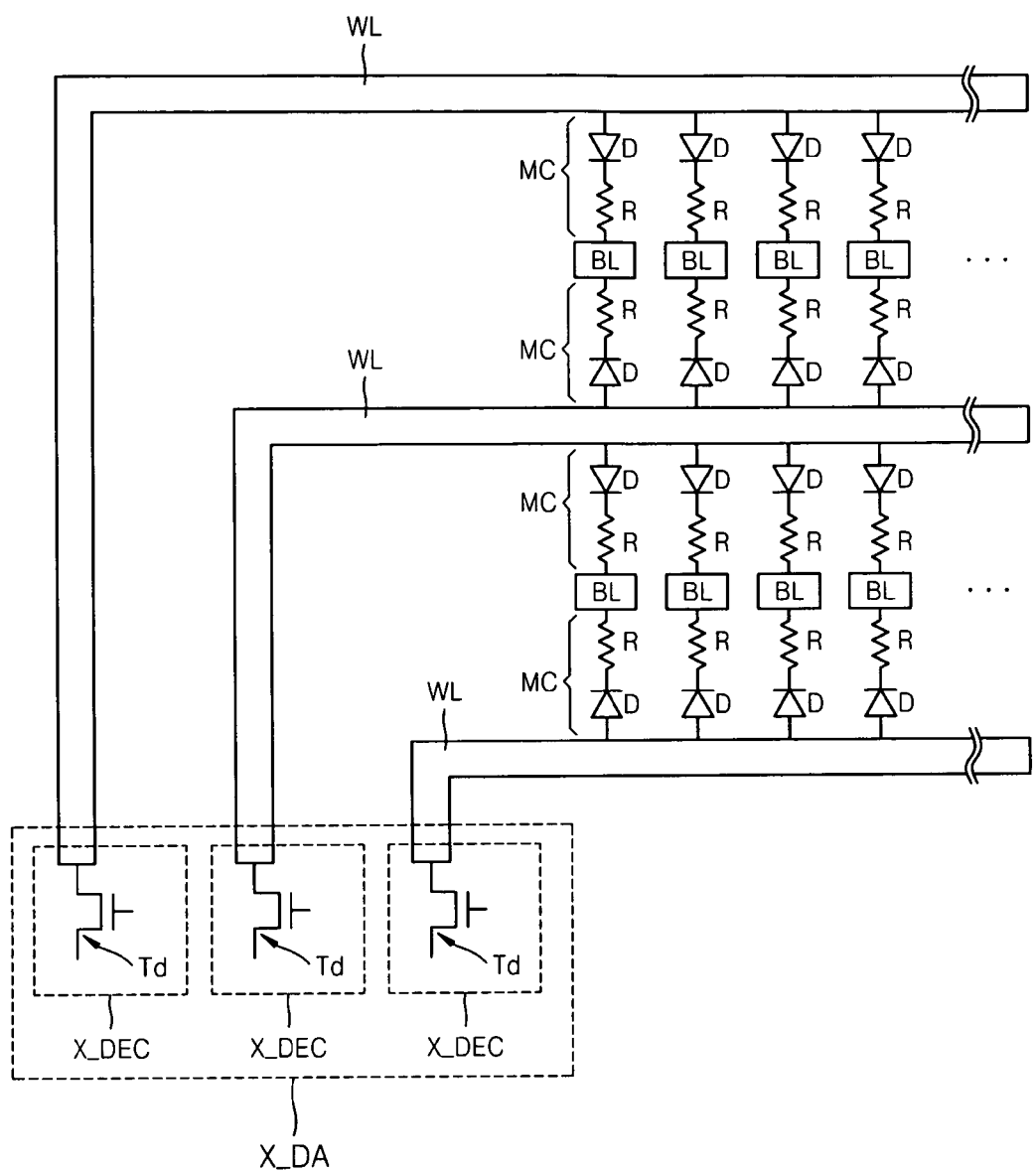

FIG. 20 is a cross-sectional view showing physical connections between memory layers and an X-decoder array X-DA in a stacked memory device, according to example embodiments. The stacked memory device 2 illustrated in FIG. 7 may be physically realized as illustrated in FIG. 20.

Referring to FIG. 20, a plurality of memory cells MC may be stacked into a plurality of layers, e.g., four layers. The stacked memory device illustrated in FIG. 20 is partially modified from the stacked memory device FIG. 18 and thus repeated descriptions will not be provided here.

Each of a plurality of word lines WL may extend in a direction so as to be commonly connected to two neighboring layers of the memory cells MC. For example, the memory cells MC of second and third layers may share one word line WL. Also, a plurality of bit lines BL may extend to cross the word lines WL by interposing the memory cells MC therebetween. For example, the memory cells MC of first and second layers may share bit lines BL and/or the memory cells MC of third and fourth layers may share bit lines BL. According to example embodiments, as the word lines WL and the bit lines BL are shared, total numbers of the word lines WL and the bit lines BL may be reduced. Accordingly, a process cost may be reduced and an area required to form decoders may also be reduced.

The word lines WL may be connected to the X-decoder array X-DA. The X-decoder array X-DA may include a number of X-decoders X-DEC less than the number of stacked layers of the memory cells MC. The X-decoders X-DEC may be connected to the word lines WL. According to example embodiments, the number of X-decoders X-DEC may be reduced by using the sharing structure.

Figure 21:
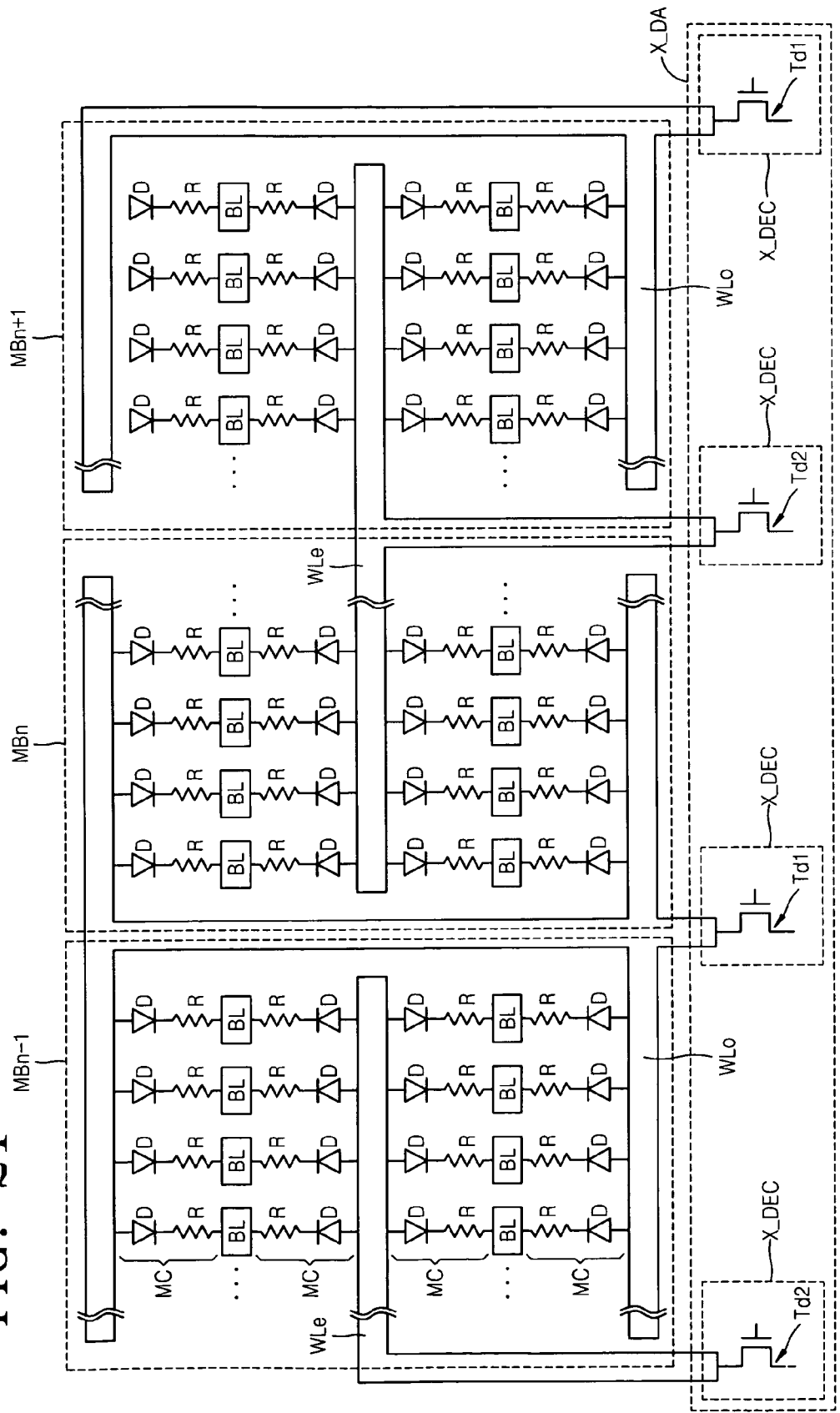

FIG. 21 is a cross-sectional view showing physical connections between memory layers and an X-decoder array X-DA in a stacked memory device, according to example embodiments. The stacked memory devices 3' and 4' illustrated in FIGS. 11 and 12, and 16 and 17 may be physically realized as illustrated in FIG. 21.

Referring to FIG. 21, a plurality of memory cells MC in memory blocks MBn−1, MBn, and MBn+1 may be stacked into a plurality of layers, e.g., four layers. The stacked memory device illustrated in FIG. 21 is partially modified from the stacked memory device FIG. 20 by expanding the stacked memory device in memory blocks and thus repeated descriptions will not be provided here.

A plurality of word lines WLe and WLo may be alternately disposed so that each of the word lines WLe and WLo is commonly connected to two neighboring layers of the memory cells MC. For example, second and third layers of the memory cells MC may be commonly connected to the word lines WLe disposed between the second and third layers of the memory cells MC. On the other hand, first and fourth layers of the memory cells MC may be commonly connected to the word lines WLo adjacent to the first and fourth layers of the memory cells MC. A plurality of bit lines BL may extend to cross the word lines WLe and WLo by interposing the memory cells MC therebetween.

The word lines WLe and WLo may be connected to the X-decoder array X-DA. The X-decoder array X-DA may include a plurality of X-decoders X-DEC. For example, the word lines WLo of neighboring memory blocks MBn−1 and MBn may be connected to each other so as to be commonly connected to an X-decoder X-DEC. The word lines WLe of other neighboring memory blocks MBn and MBn+1 may be connected to each other so as to be commonly connected to another X-decoder X-DEC. Although the X-decoders X-DEC of the X-decoder array X-DA are illustrated at the same level in FIG. 21, the X-decoders X-DEC may be disposed in different layers and may be included in different memory blocks MBn−1, MBn and MBn+1.

Figure 22:
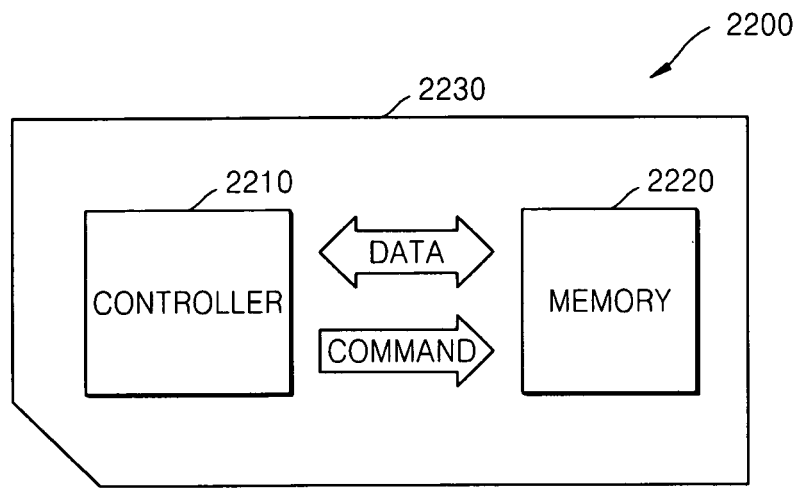
FIG. 22 is a schematic diagram of a memory card according to example embodiments.

FIG. 22 is a schematic diagram of a memory card 2200 according to example embodiments.

Referring to FIG. 22, the memory card 2200 may include a controller 2210 and/or a memory unit 2220 in a housing 2230. The controller 2210 and the memory unit 2220 may exchange electrical signals with each other. For example, the memory unit 2220 and the controller 2210 may exchange data with each other according to a command of the controller 2210. As such, the memory card 2200 may store data in the memory unit 2220 and/or may output data from the memory unit 2220 to outside the memory card 2200.

For example, the memory unit 2220 may include at least one of the stacked memory devices 1, 1', 1'', 2, 3, 3', 4, and 4' illustrated in FIGS. 1 through 21. The memory card 2200 may be used as a data storage medium of various portable devices. For example, the memory card 2200 may include a multimedia card (MMC) or a secure digital (SD) card.

Figure 23:
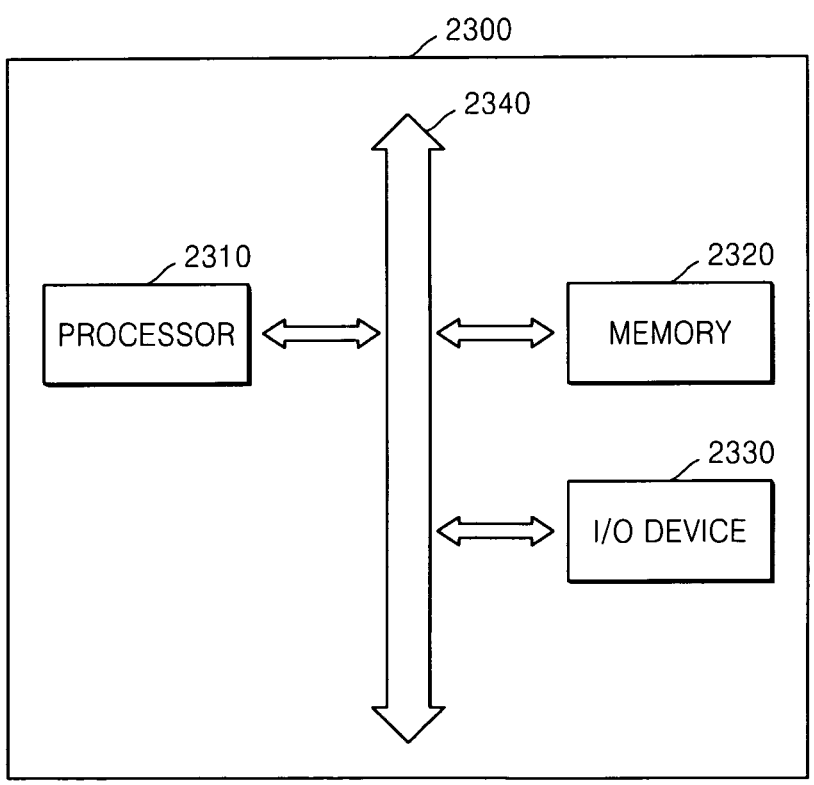
FIG. 23 is a block diagram of an electronic system according to example embodiments.

FIG. 23 is a block diagram of an electronic system 2300 according to example embodiments.

Referring to FIG. 23, the electronic system 2300 may include a processor 2310, an input/output device 2330, and/or a memory unit 2320 that may communicate data by using a bus 2340. The processor 2310 may execute a program and may control the electronic system 2300. The input/output device 2330 may be used to input or output data of the electronic system 2300. The electronic system 2300 may be connected to an external device such as a personal computer or a network by using the input/output device 2330 so as to exchange data with the external device. The memory unit 2320 may store codes and data for operating the processor 2310. For example, the memory unit 2320 may include at least one of the stacked memory devices 1, 1', 1'', 2, 3, 3', 4, and 4' illustrated in FIGS. 1 through 21.

For example, the electronic system 2300 may be used in various electronic control devices including the memory unit 2320, for example, a mobile phone, an MP3 player, a vehicle navigator, a solid state disk (SSD), or household appliances.

As described above, according to the one or more example embodiments, X-decoders and Y-decoders may be separately stacked in different layers. Accordingly, since X-decoders and Y-decoders do not need to be disposed at one layer, an area required to form an X-decoder or a Y-decoder of each layer may be greatly reduced. As such, restrictions in number of stacked memory layers may be reduced and thus integration of a stacked memory device may be increased.

Also, X-decoder arrays and/or Y-decoder arrays may be disposed in the form of a grid at the same level of a plurality of memory blocks. Accordingly, memory layers may be connected to an X-decoder array or a Y-decoder array of a memory block and may also connected to an X-decoder array or a Y-decoder array at the same level of a neighboring memory block. As such, connection lines between memory layers and an X-decoder or a Y-decoder may be reduced.

Furthermore, memory cells of each memory layer may be grouped into at least two groups and memory layers may correspond to a plurality of X-decoder pairs or a plurality of Y-decoder pairs. Accordingly, the number of memory cells decoded by each X-decoder or Y-decoder may be reduced and thus each X-decoder or Y-decoder may be simply realized with reduced complexity.

While example embodiments have been particularly shown and described, it will be understood by those of ordinary skill in the art that various changes in form and details may be made therein without departing from the spirit and scope of the present invention as defined by the following claims.

What is claimed is:

1. A stacked memory device, comprising:
    a substrate;
    a plurality of memory groups sequentially stacked on the substrate, each memory group comprising at least one memory layer;
    a plurality of X-decoder layers, at least one of the plurality of X-decoder layers being disposed between every alternate neighboring two of the plurality of memory groups; and
    a plurality of Y-decoder layers disposed alternately with the plurality of X-decoder layers, at least one of the plurality of Y-decoder layers being disposed between every alternate neighboring two of the plurality of memory groups;
    wherein the plurality of the Y-decoder layers comprises a plurality of pairs of first and second Y-decoder layers that alternate with the plurality of X-decoder layers, or the plurality of X-decoder layers comprises a plurality of pairs of first and second X-decoder layers that alternate with the plurality of Y-decoder layers.

2. The stacked memory device of claim 1, wherein at least one of the plurality of memory groups is disposed between each of the X-decoder layers and each of the Y-decoder layers.

3. The stacked memory device of claim 1, wherein the plurality of the memory groups comprises a same number of memory layers.

4. The stacked memory device of claim 1, wherein the plurality of X-decoder layers and the plurality of Y-decoder layers are alternately disposed between the plurality of memory groups.

5. The stacked memory device of claim 4, wherein each of the X-decoder layers is connected to a neighboring two of the plurality of memory groups, which are stacked on and under each of the X-decoder layers, respectively.

6. The stacked memory device of claim 4, wherein each of the Y-decoder layers is connected to a neighboring two of the plurality of memory groups, which are stacked on and under each of the Y-decoder layers, respectively.

7. The stacked memory device of claim 1, wherein when the plurality of the Y-decoder layers comprises the plurality of pairs of the first and second Y-decoder layers that alternate with the plurality of X-decoder layers:
the first and second Y-decoder layers of each of the pairs of the first and second Y-decoder layers are stacked on one another, and
each of the plurality of X-decoder layers is disposed between every alternate neighboring two of the plurality of memory groups.

8. The stacked memory device of claim 7, wherein the first and second Y-decoder layers of each of the pairs of the first and second Y-decoder layers are separately connected to a neighboring two of the plurality of memory groups.

9. The stacked memory device of claim 7, wherein each of the X-decoder layers is connected to a neighboring two of the plurality of memory groups, which are stacked on and under each of the X-decoder layers, respectively.

10. The stacked memory device of claim 1, wherein when the plurality of X-decoder layers comprises the plurality of pairs of the first and second X-decoder layers that alternate with the plurality of Y-decoder layers;
the first and second X-decoder layers of each of the pairs of the first and second X-decoder layers are stacked on one another, and
each of the plurality of Y-decoder layers is disposed between every alternate neighboring two of the plurality of memory groups.

11. The stacked memory device of claim 10, wherein the first and second X-decoder layers of each of the pairs of the first and second X-decoder layers are separately connected to a neighboring two of the plurality of memory groups.

12. The stacked memory device of claim 10, wherein each of the Y-decoder layers is connected to a neighboring two of the plurality of memory groups, which are stacked on and under each of the Y-decoder layers, respectively.

13. A stacked memory device, comprising:
a substrate;
a plurality of memory groups sequentially stacked on the substrate, each memory group comprising at least one memory layer;
a plurality of X-decoder layers, at least one of the plurality of X-decoder layers being disposed between every alternate neighboring two of the plurality of memory groups; and
a plurality of Y-decoder layers disposed alternately with the plurality of X-decoder layers, at least one of the plurality of Y-decoder layers being disposed between every alternate neighboring two of the plurality of memory groups;
wherein each of the plurality of X-decoder layers comprises a number of X-decoder pairs corresponding to a number of memory layers in each of the plurality of memory groups, and
wherein each of the plurality of Y-decoder layers comprises a number of Y-decoder pairs corresponding to the number of memory layers in each of the plurality of memory groups.

14. The stacked memory device of claim 13, wherein memory cells of each of the memory layers are grouped into first and second groups,
wherein X-decoders of each of the X-decoder pairs are separately connected to the first and second groups of a corresponding memory layer, and
wherein Y-decoders of each of the Y-decoder pairs are separately connected to the first and second groups of a corresponding memory layer.

15. A stacked memory device, comprising:
a substrate;
a plurality of memory groups sequentially stacked on the substrate, each memory group comprising at least one memory layer;
a plurality of X-decoder layers, at least one of the plurality of X-decoder layers being disposed between every alternate neighboring two of the plurality of memory groups; and
a plurality of Y-decoder layers disposed alternately with the plurality of X-decoder layers, at least one of the plurality of Y-decoder layers being disposed between every alternate neighboring two of the plurality of memory groups;
wherein each of the plurality of X-decoder layers comprises a number of X-decoders corresponding to a number of memory layers in each of the plurality of memory groups, and
wherein each of the plurality of Y-decoder layers comprises a number of Y-decoders corresponding to the number of memory layers in each of the plurality of memory groups.

16. A stacked memory device comprising a plurality of stacked memory blocks disposed on a substrate, each of the plurality of stacked memory blocks comprising:
a plurality of memory groups sequentially stacked on the substrate, each memory group comprising at least one memory layer;
a plurality of X-decoder arrays, each X-decoder array being disposed in every other memory group from among the plurality of memory groups; and
a plurality of Y-decoder arrays disposed alternately with the plurality of X-decoder arrays, each Y-decoder array being disposed in every other memory group from among the plurality of memory groups;
wherein the plurality of X-decoder arrays of each of the stacked memory blocks are disposed at same levels as the plurality of Y-decoder arrays of neighboring stacked memory blocks.

17. The stacked memory device of claim 16, wherein each of the plurality of memory groups is commonly connected to at least one word line, and
wherein each of the plurality of X-decoder arrays in each stacked memory block comprises at least one X-decoder connected to the at least one word line.

18. The stacked memory device of claim 16, wherein each of the plurality of memory groups is connected to at least one pair of word lines, and
wherein each of the plurality of the X-decoder arrays in each stacked memory block comprises at least one pair of X-decoders connected to the at least one pair of word lines.

19. The stacked memory device of claim 16, wherein each of the plurality of X-decoder arrays comprises a number of X-decoder pairs corresponding to one half of a number of memory layers in each of the plurality of memory groups, and each of the X-decoder pairs is commonly connected to at least two of the memory layers, and wherein each of the plurality of Y-decoder arrays comprises a number of Y-decoder pairs corresponding to one half of the number of memory layers in each of the plurality of memory groups, and each of the Y-decoder pairs is commonly connected to at least two of the memory layers.

20. The stacked memory device of claim 19, wherein memory cells of each of the memory layers are grouped into first and second groups, wherein X-decoders of each of the X-decoder pairs are separately connected to the first and second groups of a corresponding memory layer, and wherein Y-decoders of each of the Y-decoder pairs are separately connected to the first and second groups of a corresponding memory layer.

21. The stacked memory device of claim 16, wherein each of the plurality of X-decoder arrays comprises a number of X-decoders corresponding to one half of a number of memory layers in each of the plurality of memory groups, and each of the X-decoders is commonly connected to at least two of the memory layers, and wherein each of the plurality of Y-decoder arrays comprises a number of Y-decoders corresponding to one half of the number of memory layers in each of the plurality of memory groups, and each of the Y-decoders is commonly connected to at least two of the memory layers.

22. A stacked memory device, comprising:
a substrate;
a plurality of first memory groups sequentially stacked on the substrate, each first memory group comprising one or more first memory layers;
a plurality of second memory groups sequentially stacked on the substrate separately from the plurality of first memory groups, each second memory group comprising one or more second memory layers; and
one or more decoder layers in at least one of the plurality of first memory groups and in at least one of the plurality of second memory groups;
wherein the one or more decoder layers comprise:
an X-decoder array comprising at least one X-decoder; and
a Y-decoder array comprising at least one Y-decoder; and
wherein the X-decoder array and the Y-decoder array in each of the one or more decoder layers are disposed in a grid pattern.

23. The stacked memory device of claim 22, wherein the X-decoder array comprises a plurality of X-decoders, and wherein the Y-decoder array comprises a plurality of Y-decoders.

24. The stacked memory device of claim 23, wherein the plurality of X-decoders and the plurality of Y-decoders are alternately disposed.

25. The stacked memory device of claim 22, wherein the one or more decoder layers comprise a plurality of decoder layers in the plurality of first memory groups, second memory groups, or first and second memory groups.

26. The stacked memory device of claim 25, wherein a decoder layer in one of the plurality of first memory groups, neighboring a decoder layer in one of the plurality of second memory groups, has an opposite decoder arrangement to that of the decoder layer in the one of the plurality of second memory groups.

27. The stacked memory device of claim 25, wherein the plurality of decoder layers alternately have two opposite decoder arrangements.

28. The stacked memory device of claim 22, wherein each of the one or more first and second memory layers uses a variable resistor as a storage medium.

* * * * *